United States Patent
Su et al.

(10) Patent No.: US 11,735,469 B2
(45) Date of Patent: Aug. 22, 2023

(54) METHOD OF FORMING A SEMICONDUCTOR DEVICE

(71) Applicant: Taiwan Semiconductor Manufacturing Co., Ltd., Hsinchu (TW)

(72) Inventors: Yi-Nien Su, Hsinchu (TW); Shu-Huei Suen, Jhudong Township (TW); Jyu-Horng Shieh, Hsinchu (TW); Ru-Gun Liu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/661,600

(22) Filed: May 2, 2022

(65) Prior Publication Data

US 2022/0262674 A1 Aug. 18, 2022

Related U.S. Application Data

(63) Continuation of application No. 17/120,989, filed on Dec. 14, 2020, now Pat. No. 11,322,393, which is a
(Continued)

(51) Int. Cl.
*H01L 21/76* (2006.01)
*H01L 21/31* (2006.01)
(Continued)

(52) U.S. Cl.
CPC .. *H01L 21/76802* (2013.01); *H01L 21/02271* (2013.01); *H01L 21/02282* (2013.01);
(Continued)

(58) Field of Classification Search
CPC ......... H01L 21/76802; H01L 21/02271; H01L 21/02282; H01L 21/2633; H01L 21/31116; H01L 21/31144; H01L 21/76877
(Continued)

(56) References Cited

U.S. PATENT DOCUMENTS

| 841,551 A | 1/1907 | Loomis |
| 5,670,062 A | 9/1997 | Lin et al. |

(Continued)

FOREIGN PATENT DOCUMENTS

| CN | 107887260 A | 4/2018 |
| KR | 100455640 B1 | 1/2005 |

(Continued)

*Primary Examiner* — Sheikh Maruf
(74) *Attorney, Agent, or Firm* — Slater Matsil, LLP

(57) ABSTRACT

A method includes depositing a second dielectric layer over a first dielectric layer, depositing a third dielectric layer over the second dielectric layer, patterning a plurality of first openings in the third dielectric layer, etching the second dielectric layer through the first openings to form second openings in the second dielectric layer, performing a plasma etching process directed at the second dielectric layer from a first direction, the plasma etching process extending the second openings in the first direction, and etching the first dielectric layer through the second openings to form third openings in the first dielectric layer.

20 Claims, 20 Drawing Sheets

Related U.S. Application Data continuation of application No. 16/525,845, filed on Jul. 30, 2019, now Pat. No. 10,867,840.

(60) Provisional application No. 62/737,755, filed on Sep. 27, 2018.

(51) Int. Cl.
*H01L 21/768* (2006.01)
*H01L 21/02* (2006.01)
*H01L 21/263* (2006.01)
*H01L 21/311* (2006.01)

(52) U.S. Cl.
CPC .... *H01L 21/2633* (2013.01); *H01L 21/31116* (2013.01); *H01L 21/31144* (2013.01); *H01L 21/76877* (2013.01)

(58) Field of Classification Search
USPC .......................................................... 438/618
See application file for complete search history.

(56) References Cited

U.S. PATENT DOCUMENTS

| | | | |
|---|---|---|---|
| 6,091,081 A * | 7/2000 | Matsubara | H01L 21/76834 257/77 |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,835,323 B1 * | 9/2014 | Shieh | H01L 21/76816 438/689 |
| 2001/0051420 A1 | 12/2001 | Besser et al. | |
| 2003/0148587 A1 | 8/2003 | Suzuki et al. | |
| 2006/0122101 A1 | 6/2006 | Miyazaki et al. | |
| 2007/0009838 A1 | 1/2007 | You et al. | |
| 2007/0128526 A1 | 6/2007 | Wallace et al. | |
| 2007/0148966 A1 | 6/2007 | Baks et al. | |
| 2007/0172770 A1 | 7/2007 | Witters et al. | |
| 2008/0122101 A1 | 5/2008 | Oku et al. | |
| 2009/0035902 A1 | 2/2009 | Xu et al. | |
| 2010/0041237 A1 | 2/2010 | Lee et al. | |
| 2010/0203722 A1 | 8/2010 | Bao et al. | |
| 2012/0205746 A1 | 8/2012 | Wang | |
| 2013/0196481 A1 | 8/2013 | Lee et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0012459 A1 | 5/2014 | Liu et al. | |
| 2014/0117563 A1 | 5/2014 | Yu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273424 A1 | 9/2014 | Liu et al. | |
| 2014/0273521 A1 | 9/2014 | Wu et al. | |
| 2014/0353839 A1 * | 12/2014 | Lin | H01L 21/02175 257/734 |
| 2015/0140803 A1 | 5/2015 | Wells et al. | |
| 2015/0200095 A1 | 7/2015 | Huang et al. | |
| 2015/0228586 A1 * | 8/2015 | Usami | H01L 21/76831 438/643 |
| 2015/0311151 A1 * | 10/2015 | Chi | H01L 21/7682 438/653 |
| 2016/0126179 A1 * | 5/2016 | Takahashi | H01L 21/76802 438/618 |
| 2016/0155730 A1 * | 6/2016 | Yu | H01L 21/0228 257/774 |
| 2016/0163641 A1 * | 6/2016 | Bao | H01L 21/3065 438/3 |
| 2016/0314972 A1 | 10/2016 | Huang et al. | |
| 2017/0062222 A1 | 3/2017 | Yang et al. | |
| 2017/0103894 A1 | 4/2017 | Aichinger et al. | |
| 2017/0316981 A1 * | 11/2017 | Chen | H01L 21/0217 |
| 2018/0090370 A1 | 3/2018 | Hung et al. | |
| 2018/0166383 A1 * | 6/2018 | Cao | H01L 23/5329 |
| 2018/0315601 A1 * | 11/2018 | Peng | H01L 21/3088 |
| 2019/0006174 A1 * | 1/2019 | Huang | H01L 21/76816 |
| 2019/0157094 A1 * | 5/2019 | Lin | H01L 21/76811 |

FOREIGN PATENT DOCUMENTS

| | | |
|---|---|---|
| KR | 20080030396 A | 4/2008 |
| KR | 20160100921 A | 8/2016 |
| KR | 20170044029 A | 4/2017 |
| TW | 201701323 A | 1/2017 |
| TW | 201824391 A | 7/2018 |

* cited by examiner

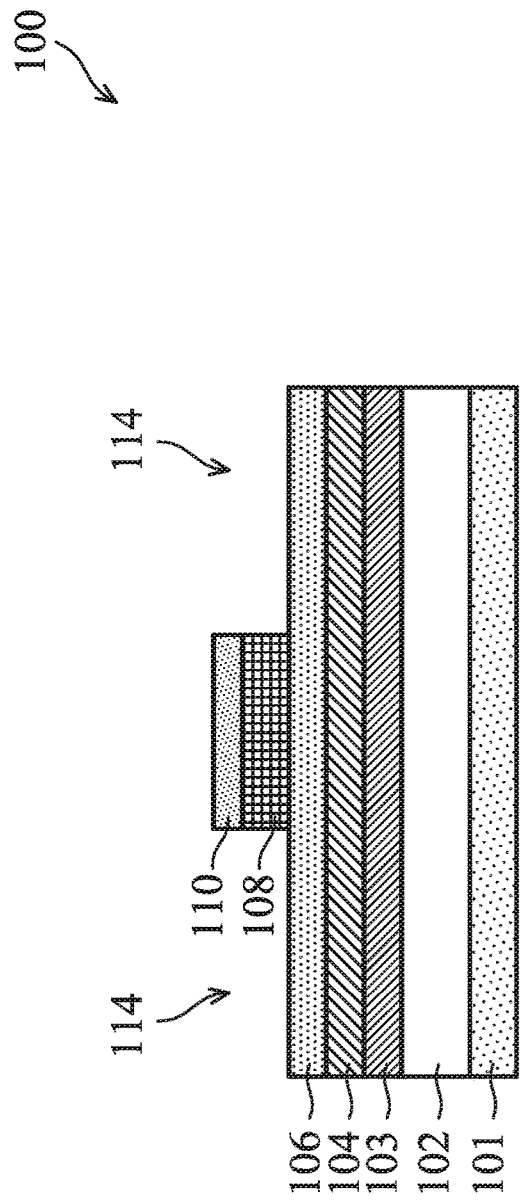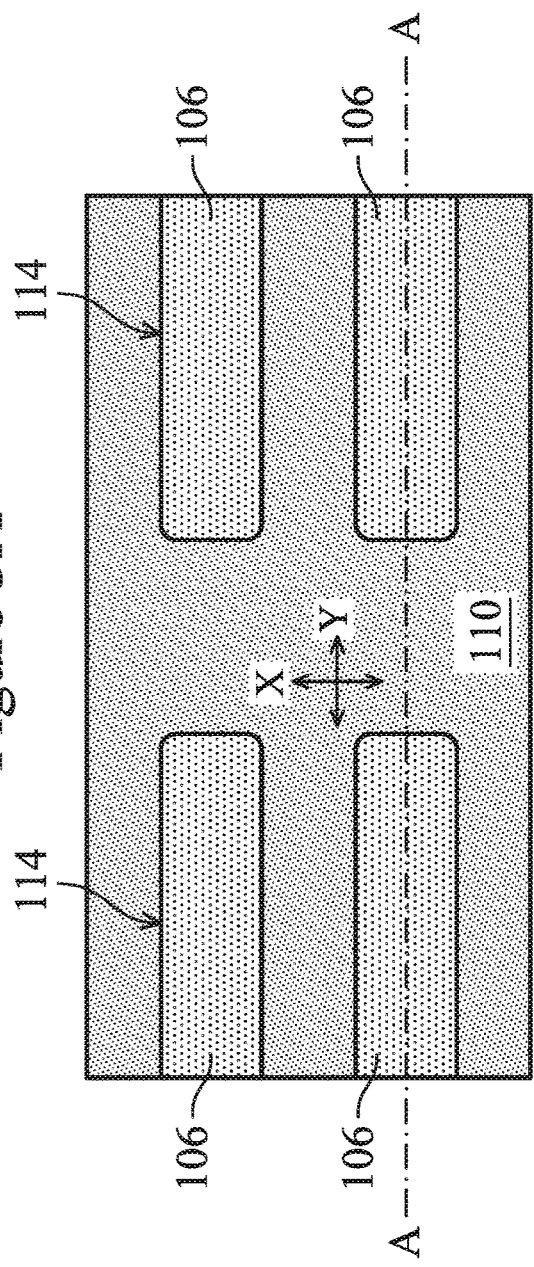
Figure 3A
Figure 3B

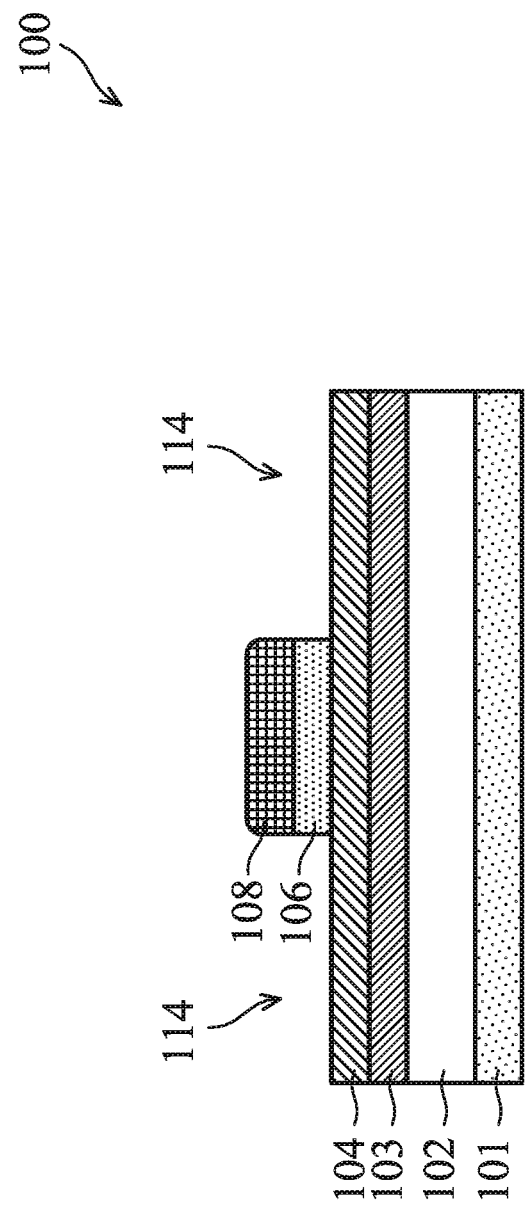
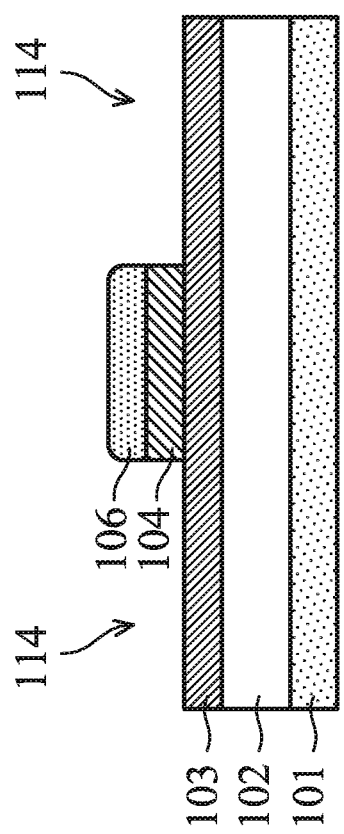

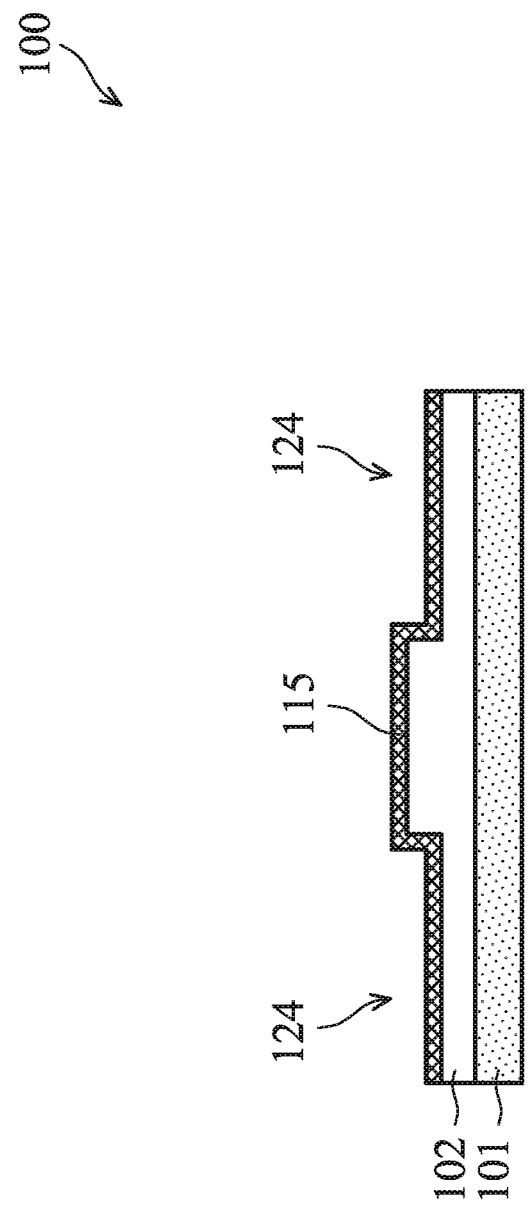
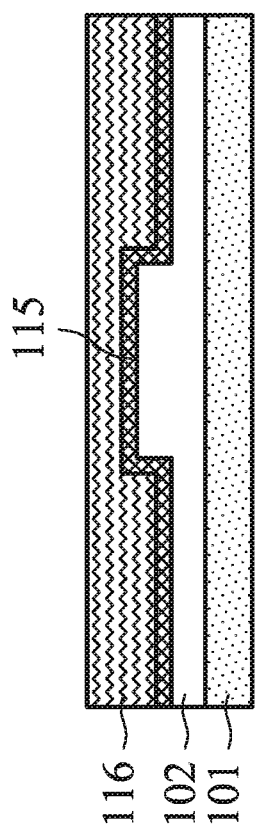
Figure 8
Figure 9

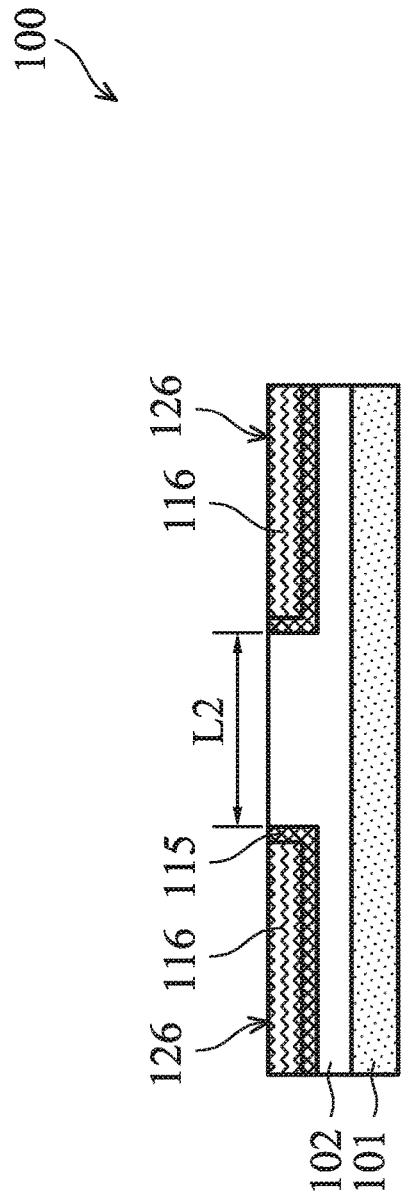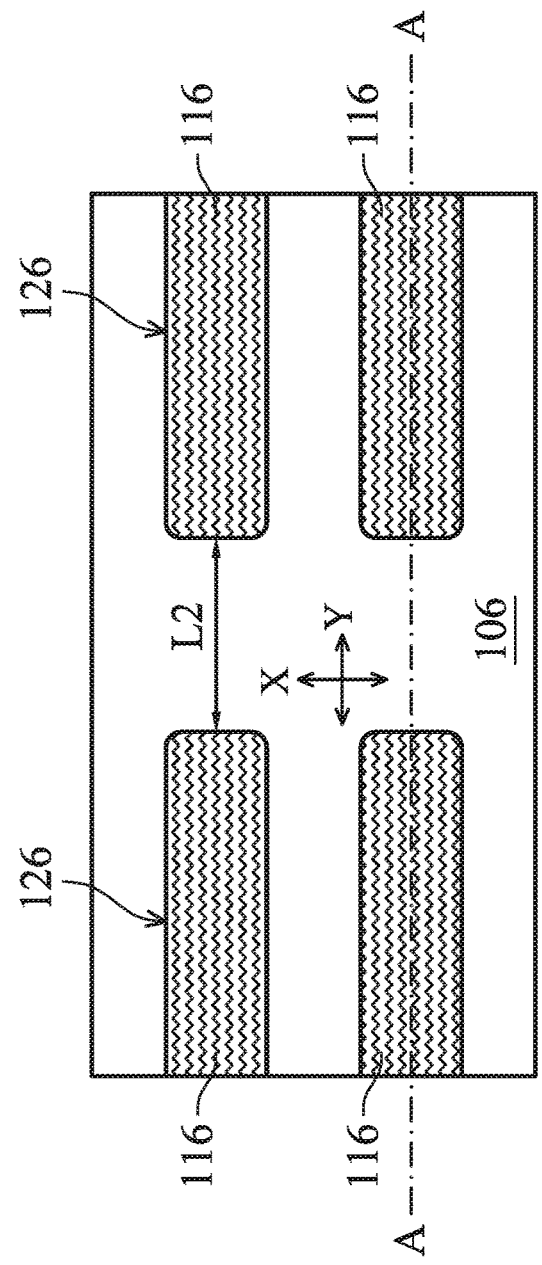

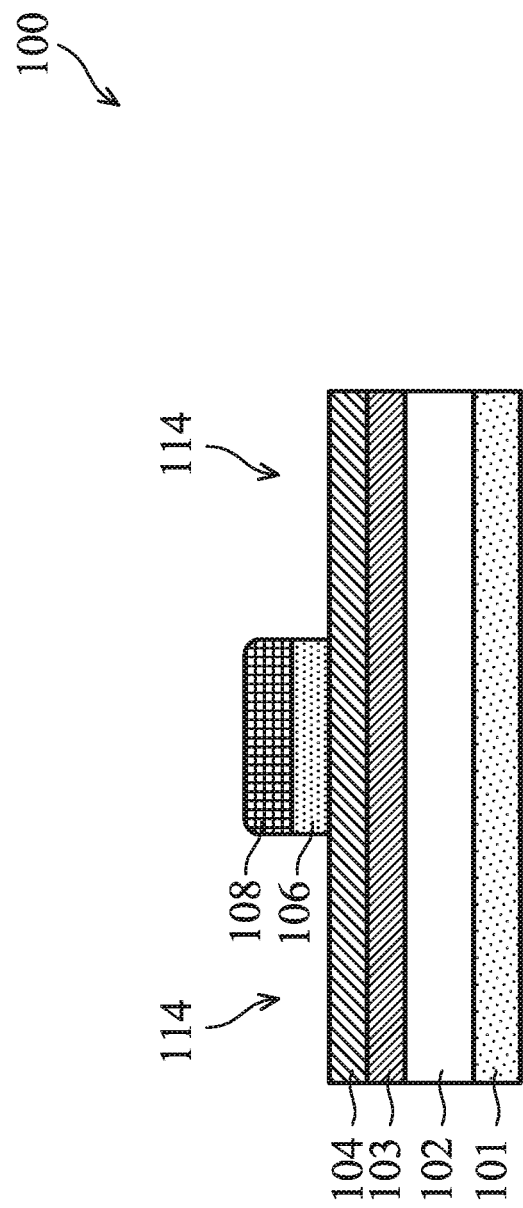

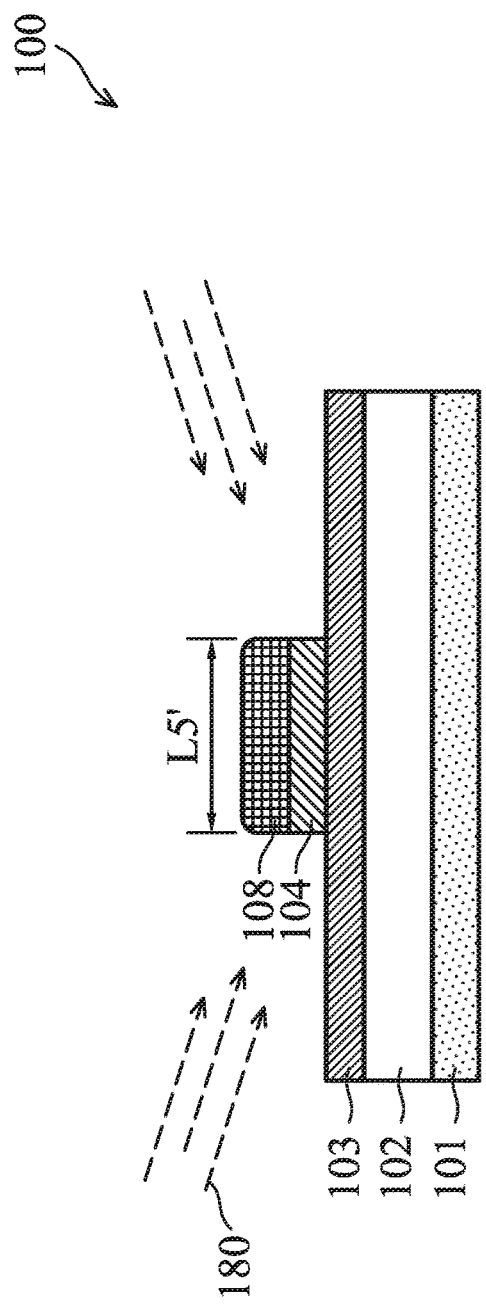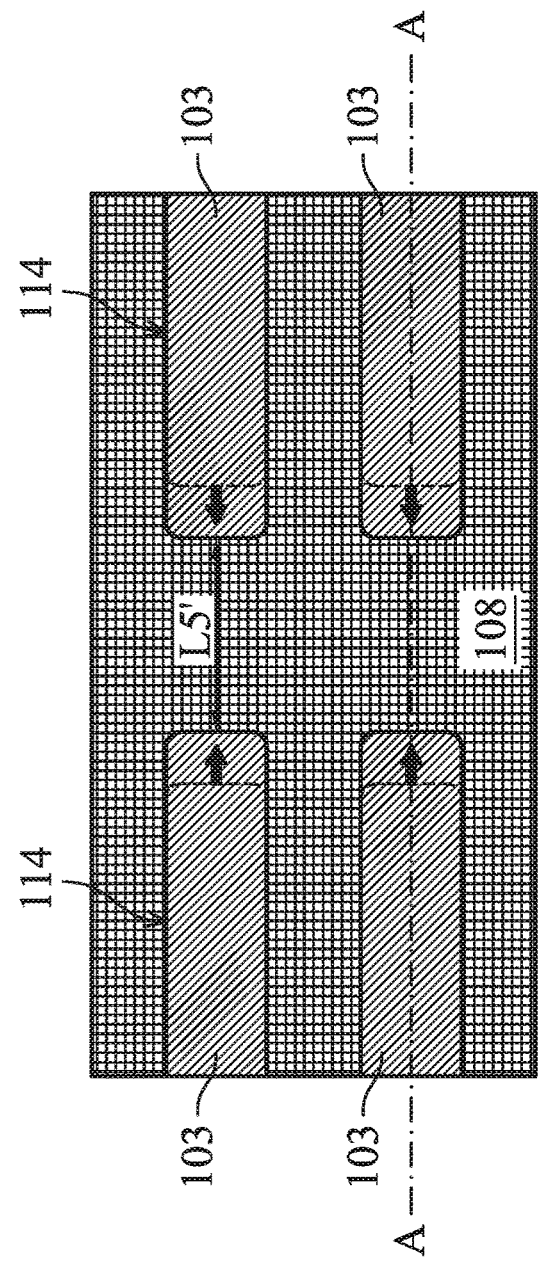

METHOD OF FORMING A SEMICONDUCTOR DEVICE

PRIORITY

This application is a continuation application of U.S. patent application Ser. No. 17/120,989, filed on Dec. 14, 2020, which is a continuation application of U.S. patent application Ser. No. 16/525,845, filed on Jul. 30, 2019, now U.S. Pat. No. 10,867,940, issued on Dec. 15, 2020, which claims the benefit of U.S. Provisional Application No. 62/737,755, filed on Sep. 27, 2018, which applications are incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-B illustrate a plan view and a cross-sectional view of the patterning of a masking layer in accordance with some embodiments.

FIGS. 4-5 illustrate the patterning of mask layers in accordance with some embodiments.

FIGS. 8-10B illustrate a plan view and cross-sectional views of the formation of conductive lines in the IMD layer in accordance with some embodiments.

FIG. 16 illustrates the patterning of a mask layer in accordance with some embodiments.

FIGS. 25A-B illustrate a plan view and a cross-sectional view of the performing a directional etching process in accordance with some embodiments.

DETAILED DESCRIPTION

Figure 1A:
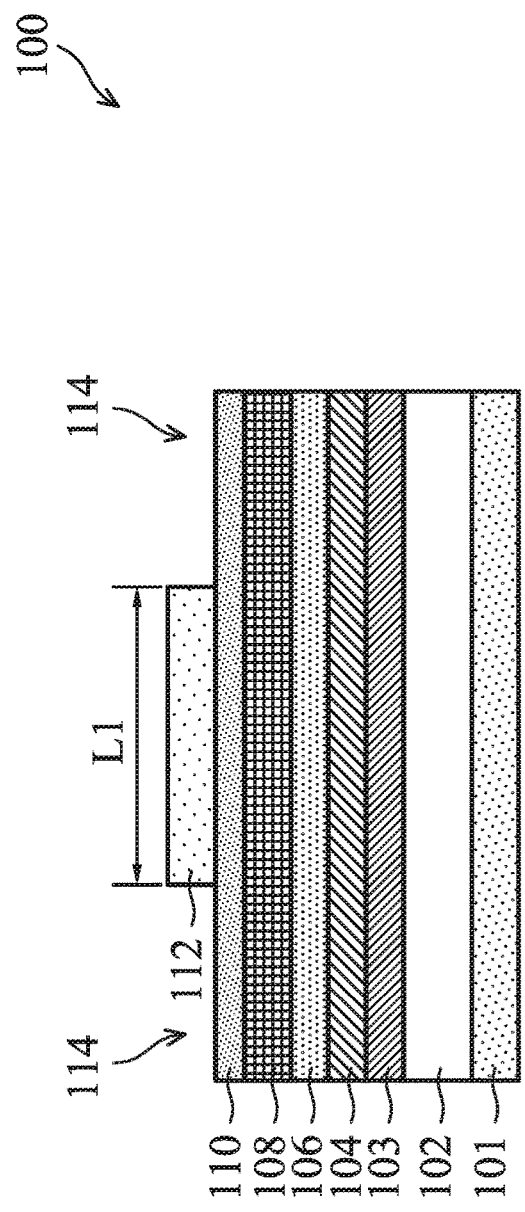
FIGS. 1A-B illustrate a plan view and a cross-sectional view of the patterning of a photoresist layer of a device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 25B illustrate cross-sectional views and/or plan views of intermediate stages in the formation of conductive lines in a semiconductor device 100, in accordance with some exemplary embodiments. The cross-sectional view of Figures with an "A" designation, is along line A-A' shown in the plan view of the associated Figure with a "B" designation. For example, the cross-sectional view of FIG. 1A is along line A-A' shown in FIG. 1B. The IMD layer 102 is a layer in which a pattern is to be formed in accordance with embodiments of the present disclosure. In some embodiments, the conductive lines may be part of a metallization structure or an interconnect structure of a semiconductor device, and may be formed of a metal. For example, the conductive lines formed using the techniques described herein may be used to form conductive interconnects as part of a Back End of Line (BEOL) process or a Front End of Line (FEOL) process. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

Figure 1B:
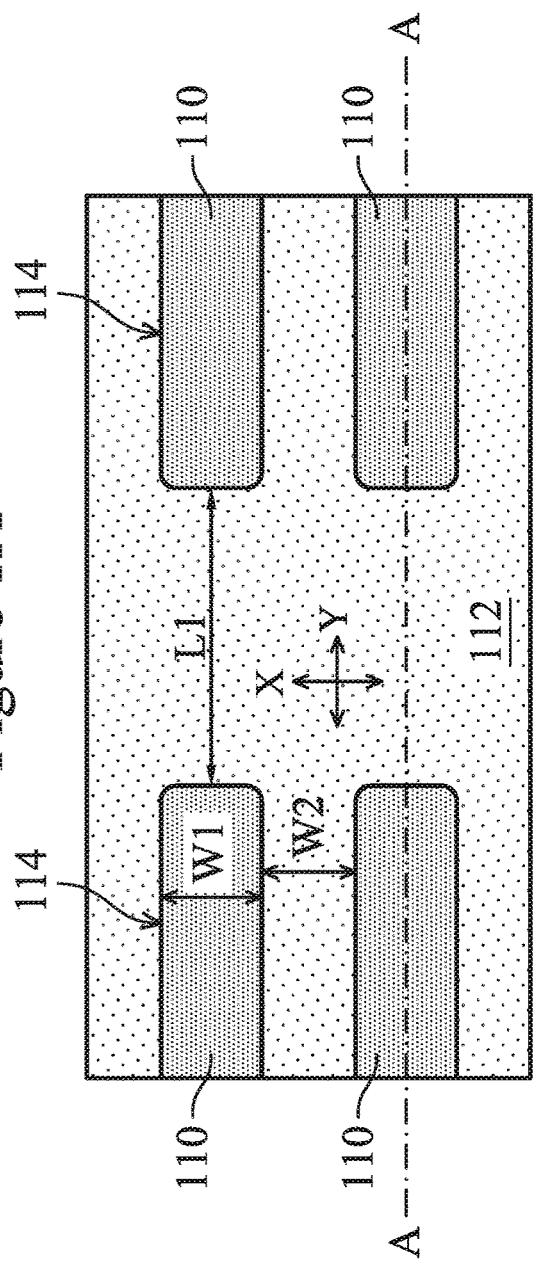

In some embodiments, the conductive lines are formed in a dielectric layer such as an inter-metal dielectric (IMD) layer 102. In some embodiments, openings may be patterned in the IMD layer 102 with the embodiment processes, and conductive lines may be formed in the openings as described below with regard to FIGS. 1-10B. In FIGS. 1A-B, a film stack including the IMD layer 102 is formed in a semiconductor device 100. In some embodiments, the IMD layer 102 may be formed over a semiconductor substrate 101. In some embodiments, the IMD layer 102 may be an inter-layer dielectric (ILD) layer formed over source/drain regions or the gate of a transistor (e.g., a FinFET), a dielectric layer in an interconnect structure, or a dielectric layer used in other types of metallization structures. In some embodiments, the IMD layer 102 may be formed of a dielectric material, for example, a nitride material such as silicon nitride (SiN), an oxide material such as silicon oxide (SiO), TEOS, BPTEOS, or the like. The IMD layer 102 may also be a low-k dielectric material, a polymer material, another dielectric material, the like, or combinations thereof. The IMD layer 102 may be formed by plasma enhanced chemical vapor deposition (PECVD), low pressure CVD (LPCVD), plasma vapor deposition (PVD), or the like.

The semiconductor substrate 101 may be formed of a semiconductor material such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as planar transistors, FinFETs, other types of transistors, diodes, capacitors, resistors, etc., may be formed in and/or on an active surface of semiconductor substrate 101. For example, the IMD layer 102 may be formed over the fins, metal gates, or source/drain regions of one or more FinFETs formed in the semiconductor substrate 101.

Although FIGS. 1A-B illustrate IMD layer 102 being in physical contact with semiconductor substrate 101, any number of intervening layers may be disposed between IMD layer 102 and semiconductor substrate 101. Such intervening layers may include other IMD layers or dielectric layers, and may have contact plugs, conductive lines, and/or vias formed therein, or may include one or more intermediary layers (e.g., etch stop layers, adhesion layers, etc.), combinations thereof, and the like. For example, an optional etch stop layer (not illustrated) may be disposed directly under the IMD layer 102. The etch stop layer may, for example, act as a stop for an etching process subsequently performed on the IMD layer 102. The material and process(es) used to form the etch stop layer may depend on the material of the IMD layer 102. In some embodiments, the etch stop layer may be formed of SiN, SiON, SiCON, SiC, SiOC, SiCN, SiO, other dielectrics, the like, or combinations thereof. The etch stop layer may be formed by plasma enhanced chemical vapor deposition (PECVD), low pressure CVD (LPCVD), plasma vapor deposition (PVD), or the like. Other materials and processes may be used.

A first mask layer 103 may be formed over the IMD layer 102. In subsequent processing steps, a pattern is formed on the first mask layer 103 using patterning techniques described herein. The patterned first mask layer 103 is then used as an etching mask for patterning the IMD layer 102. The first mask layer 103 may be formed of a material that includes a metal (e.g., titanium nitride (TiN), titanium, tantalum nitride, tantalum, a metal-doped carbide (e.g., tungsten carbide), or the like), a metalloid (e.g., silicon nitride, boron nitride, silicon carbide, or the like), an oxide material (e.g., titanium oxide, silicon oxide, or the like), a semiconductor material such as silicon, the like, or a combination. In some embodiments, the IMD layer 102 is a low-k material and the first mask layer 103 is an oxide material. The first mask layer 103 may be formed using a process such as CVD, ALD, or the like. In some embodiments, a material composition of the first mask layer 103 may be determined to provide a high etch selectivity with respect to other layers such as the second mask layer 104, the protective mask layer 108 (described below), or other layers. The first mask layer 103 may include more than one layer and include more than one material, and may include a material different from the second mask layer 104. In some embodiments, the first mask layer 103 has a thickness between about between about 20 nm and about 50 nm, though in other embodiments the first mask layer 103 may have another thickness.

A second mask layer 104 is formed over the first mask layer 103. The second mask layer 104 may be formed of a material that includes a metal (e.g., titanium nitride (TiN), titanium, tantalum nitride, tantalum, a metal-doped carbide (e.g., tungsten carbide), or the like), a metalloid (e.g., silicon nitride, boron nitride, silicon carbide, or the like), an oxide material (e.g., titanium oxide, silicon oxide, or the like), a semiconductor material such as silicon, the like, or a combination. The second mask layer 104 may be formed by a process such as Chemical Vapor Deposition (CVD), Atomic Layer Deposition (ALD), or the like. Other processes and materials may be used. In some embodiments, the second mask layer 104 has a thickness between about 20 nm and about 50 nm, though in other embodiments the second mask layer 104 may have another thickness. In subsequent processing steps, a pattern is formed on the second mask layer 104 using patterning techniques described herein. The second mask layer 104 is then used as an etching mask for etching the first mask layer 103, in which the pattern of the second mask layer 104 is transferred to the first mask layer 103.

A third mask layer 106 may be formed over the second mask layer 104. In subsequent processing steps, a pattern is formed on the third mask layer 106 using patterning techniques described herein. The patterned third mask layer 106 is then used as an etching mask for patterning the second mask layer 104. The third mask layer 106 may be formed of a material that includes a metal (e.g., titanium nitride (TiN), titanium, tantalum nitride, tantalum, a metal-doped carbide (e.g., tungsten carbide), or the like), a metalloid (e.g., silicon nitride, boron nitride, silicon carbide, or the like), an oxide material (e.g., titanium oxide, silicon oxide, or the like), a semiconductor material such as silicon, the like, or a combination. The third mask layer 106 may be formed using a process such as CVD, ALD, or the like. In some embodiments, a material composition of the third mask layer 106 may be determined to provide a high etch selectivity with respect to other layers such as the first mask layer 103, the second mask layer 104, the protective mask layer 108 (described below), or other layers. The third mask layer 106 may include more than one layer and include more than one material, and may include a material different from the second mask layer 104. In some embodiments, the third mask layer 106 has a thickness between about between about 20 nm and about 50 nm, though in other embodiments the third mask layer 106 may have another thickness.

A protective mask layer 108 is formed over the third mask layer 106 (if present). In subsequent processing steps, a pattern is formed on the protective mask layer 108 using patterning techniques described herein. The patterned protective mask layer 108 is then used as an etching mask for patterning the third mask layer 106. The protective mask layer 108 may be formed from a suitable dielectric material. In some embodiments, the protective mask layer 108 is a layer of a carbon material, such as a carbon-containing polymer material (e.g., a spin-on-carbon (SOC) material or the like), a layer of carbon deposited using a CVD process, or another type of carbon material. The protective mask layer 108 may be formed by a suitable process, such as CVD, ALD, Plasma-Enhanced Atomic Layer Deposition (PEALD), spin-on coating, or the like. The protective mask layer 108 may include more than one layer and include more than one material. In some embodiments, the protective mask layer 108 has a thickness between about between about 20 nm and about 50 nm, though in other embodiments the protective mask layer 108 may have another thickness.

A photoresist structure is then formed over the protective mask layer 108. The photoresist structure shown in FIGS. 1A-B includes an anti-reflection coating (ARC) 110 formed over the protective mask layer 108 and a photoresist layer 112 formed over the ARC 110. In other embodiments, the ARC 110 may be omitted (forming a mono-layer structure) or the photoresist structure may include additional layers. For example, in some embodiments the photoresist structure may include an additional layer disposed between the ARC 110 and the photoresist layer 112, forming a tri-layer structure. The ARC 110 may be a material such as silicon oxide, silicon nitride, silicon oxynitride, a polymer, the like, or a combination. The ARC 110 may have a thickness between about between about 10 nm and about 50 nm, though in other embodiments the ARC 110 may have another thickness. The photoresist layer 112 may be a photosensitive material, which includes organic materials, and may be a positive photosensitive material or a negative photosensitive material. The photoresist layer 112 may have a thickness between about between about 20 nm and about 50 nm, though in other embodiments the photoresist layer 112 may have another thickness.

FIGS. 1A through 10B illustrate intermediate stages in the formation of patterned openings in the protective mask layer 108, in accordance with some exemplary embodiments. The example patterning process shown in FIGS. 1A-10B uses a photolithographic patterning process combined with a directional etching process 150 to pattern the ILD 102 and form metal lines 126 within. The embodiments described in FIGS. 1A-10B are presented in the context of using a single photolithographic patterning process to form metal lines 126 in the IMD layer 102, but in other embodiments, two or more photolithographic patterning processes (i.e., multi-patterning) may be used. In some cases, multi-patterning processes may allow for a smaller pitch of patterned features. Other photolithographic techniques, including additional or different steps, may be used to pattern the IMD layer 102, and are within the scope of this disclosure.

As shown in FIGS. 1A-B, the photoresist layer 112 is patterned (e.g., using a photolithographic process), forming openings 114 and exposing the ARC 110. In some embodiments, the openings 114 also extend through the ARC 110. The photoresist layer 112 may be patterned using any suitable photolithography process to form openings 114 therein. For example, the photoresist layer 112 may be patterned using extreme ultraviolet (EUV) lithography techniques. In some embodiments, the openings 114 may extend lengthwise (e.g., parallel to the Y-axis indicated in FIG. 1B) and have a width W1 that is perpendicular to the lengthwise direction (e.g., parallel to the X-axis as indicated in FIG. 1B). For clarity, the directions parallel to the length will be subsequently referred to as being along the Y-axis and the directions parallel to the width will be subsequently referred to as being along the X-axis. In some embodiments, the width W1 is between about 10 nm and about 20 nm. In some embodiments, adjacent openings 114 may be separated along the X-axis by a distance W2 that is between about 10 nm and about 20 nm. In some embodiments, the ends of adjacent openings 114 may be separated along the Y-axis by a distance L1, which may be between about 30 nm and about 50 nm. In some cases, the distance L1 between adjacent openings 114 may determine the end-to-end separation distance (the "line cut") between subsequently formed metal lines. The openings 114 shown are for illustrative purposes, and may have other shapes or dimensions in other embodiments.

Figure 2A:
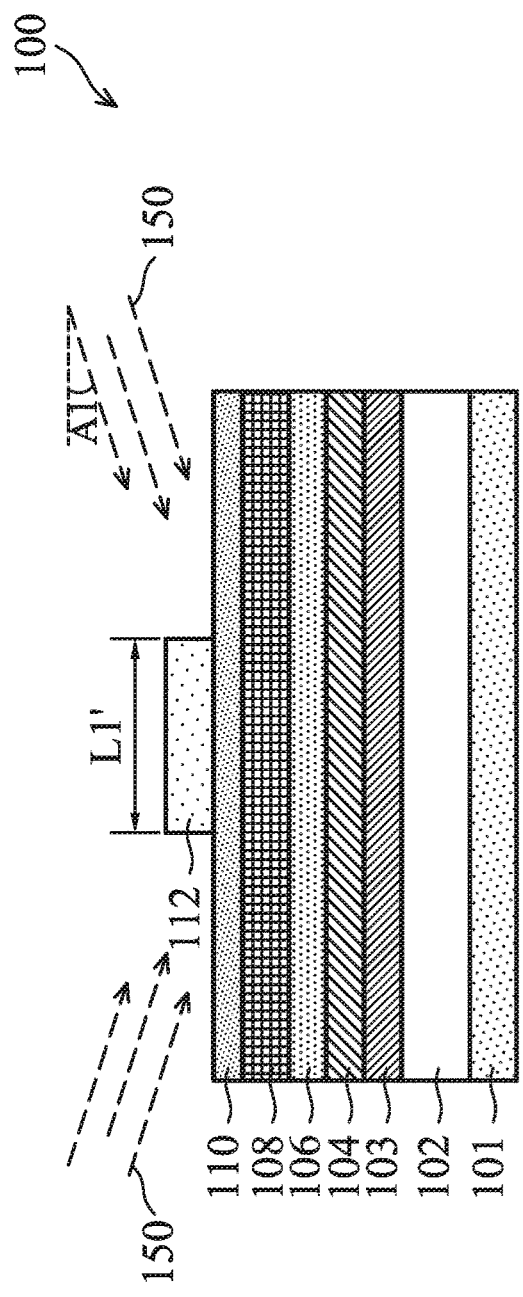
FIGS. 2A-B illustrate a plan view and a cross-sectional view of the performing a directional etching process in accordance with some embodiments.
Figure 2B:
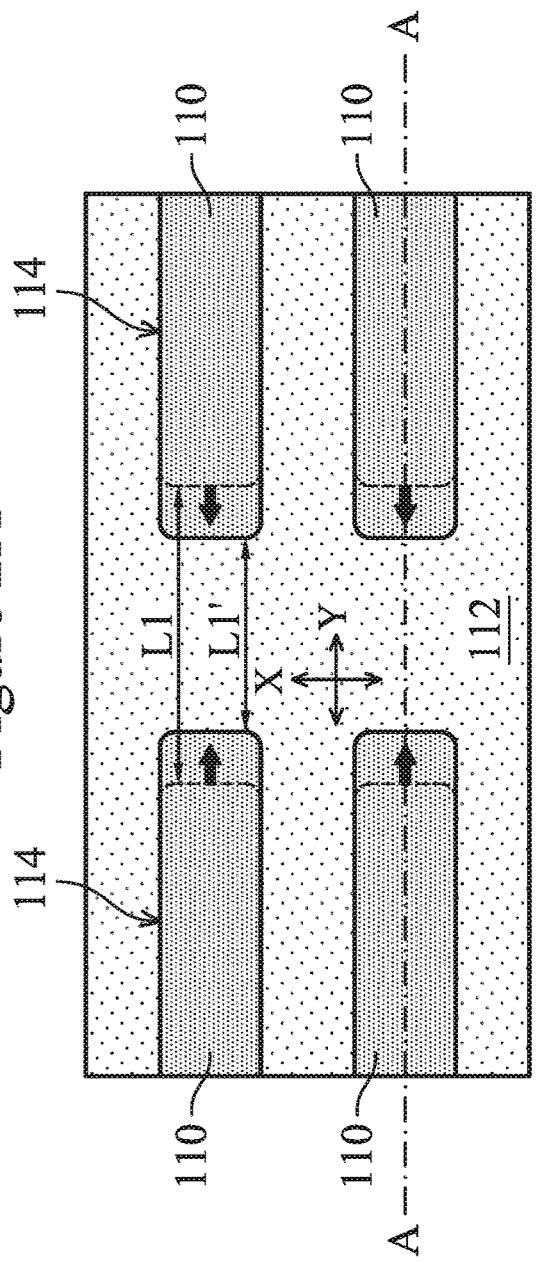

Turning to FIGS. 2A-B, a directional etching process 150 is performed on the photoresist layer 112. In some embodiments, the directional etching process 150 includes an etching process in which ions are directed toward the semiconductor device 100 at a shallow angle, as shown by the arrows in FIG. 2A. The shallow angle allows the directional etching process 150 to etch sidewalls facing the direction of the etching process. In this manner, the directional etching process 150 can etch sidewalls of the openings 114 and thus expand the openings 114. For example, by having the directional etching process 150 performed from a Y-axis direction, the directional etching process 150 can etch sidewalls of the openings 114 more in the Y-axis direction than in X-axis directions. In this manner, sidewalls facing a first direction (e.g., the Y-axis direction) may be etched more than sidewalls facing a second direction (e.g., the X-axis direction) that is perpendicular to the first direction. The directional etching process 150 may be performed from a single Y-axis direction or a single X-axis direction or from both opposite directions (e.g., from both opposite Y-axis directions or from both opposite X-axis directions). In some embodiments, the directional etching process 150 may be performed from opposite directions at the same time, and in other embodiments the directional etch process 150 is performed in opposite directions using separate steps. In some cases, the directional etching process 150 also etches top surfaces of features in addition to sidewall surfaces.

As shown in FIGS. 2A-B, the directional etching process 150 is performed on the semiconductor device 100 from both opposite Y-axis directions. In this manner, sidewalls of the photoresist layer 112 that face the Y-axis are etched by the directional etching process 150. The Y-axis etching is indicated by the arrows in FIG. 2B, showing that due to the etching process along the Y-axis, the Y-axis separation L1 has decreased to a smaller separation L1'. In some embodiments, the directional etching process 150 may etch a lateral distance between about 10 nm and about 30 nm. In some embodiments, the separation L1' may be between 10 nm and about 30 nm after the directional etching process 150 is performed in both opposite Y-axis directions. In some embodiments, after the directional etching process 150, the separation L1' may be between about 25% and about 75% of the initial separation L1, such as the separation L1' being about 50% of the separation L1. As shown in FIG. 2A-B, the sidewalls of the photoresist layer 112 that are facing the X-axis are etched less than sidewalls facing the Y-axis.

In some embodiments, the directional etching process includes a plasma etching process in which etching species of a plasma are directed toward the semiconductor device 100 at a shallow angle, as shown by the arrows in FIG. 2A. In some embodiments, the directional etching process 150 includes generating a plasma with a power between about 100 Watts and about 2000 Watts. The directional etching process 150 may be performed at a pressure between about 0.01 mTorr and about 10 mTorr and at a process temperature between about 25° C. and about 200° C. In some embodiments, the directional etching process 150 may be performed using a voltage bias between about 100 V and about 2000 V. In some embodiments, the directional etching process 150 may use one or more process gases such as $CF_4$, $CH_2F_2$, $CH_3F$, $CHF_3$, $Cl_2$, Ar, $O_2$, $N_2$, $NH_3$, $H_2$, another type of process gas, or a combination. The directional etching process 150 may direct the ions toward the semiconductor device 100 at an angle A1 that is between about 20° and about 70°.

In some embodiments, the directional etching process 150 includes directing an ion beam toward the semiconductor device 100 at a shallow angle, as shown by the arrows in FIG. 2A. In some embodiments, the ion beam may be formed and directed using, for example, an ion implantation device or the like. Ions used during the directional etching process 150 may include germanium ions, phosphorous ions, arsenic ions, argon ions, oxygen ions, fluorine ions, other species of ions, or combinations of these. In some embodiments, the ions may be directed at the semiconductor device 100 with an energy that is between about 0.5 keV and about 2 keV. The directional etching process 150 may direct the ions toward the semiconductor device 100 at an angle A1 that is between about 20° and about 70°.

In some embodiments, the directional etching process 150 also etches some or all of exposed portions of the ARC 110. In some cases, the directional etching process 150 can reduce the line width roughness (LWR) of the sidewalls of the photoresist layer 112. For example, the LWR of the photoresist layer 112 sidewalls may be reduced an amount between about 2 nm and about 4 nm. In some cases, the LWR of the photoresist layer 112 sidewalls may be as small as about 2.0 nm after performing the directional etching process 150. In some cases, the directional etching process 150 may also remove photoresist residue left remaining after patterning of the photoresist layer 112. In some cases, using a directional etching process 150 to reduce the separation distance between patterned openings can allow for smaller distances between subsequently formed metal lines, and thus can allow for a greater density of metal features.

Referring to FIGS. 3A-B, after performing the directional etching process on the photoresist layer 112, the pattern of the photoresist layer 112 is transferred to the protective mask layer 108 in an etching process. The etching process may be anisotropic, so that the openings 114 in the photoresist layer 112 are extended through the protective mask layer 108 and have about the same sizes in the protective mask layer 108 as they do in the photoresist layer 112. The resulting structure is illustrated in FIGS. 3A-B.

The etching process that etches the protective mask layer 108 may include a wet etching process, a dry etching process, or a combination. In some embodiments, a dry etching process may be a plasma etching process including a plasma generated with a power between about 100 Watts and about 2000 Watts. The plasma etching process may be performed at a pressure between about 0.01 mTorr and about 10 mTorr and at a process temperature between about 20° C. and about 200° C. The plasma etching process may include one or more process gases such as $CF_4$, $CH_2F_2$, $CH_3F$, $CHF_3$, $Cl_2$, Ar, $O_2$, another type of process gas, or a combination. For example, in some embodiments, fluorine-comprising process gases such as $CF_4$, $CH_2F_2$, $CH_3F$, or $CHF_3$ may be used to etch layers (e.g., layers 103, 104, 106, or 108, etc.) formed from some dielectric materials, and chlorine-comprising process gases such as $Cl_2$ may be used to etch layers (e.g., layers 103, 104, 106, or 108, etc.) formed from materials such as Si or TiN. These and other process gases may be used for etching these and other materials. Other etching techniques may be used in other embodiments. During the etching of the protective mask layer 108, the ARC 110 may be consumed, and third mask layer 106 may be at least partially consumed.

Referring to FIG. 4, the pattern of the protective mask layer 108 is transferred to the third mask layer 106 in an etching process. The etching process may be anisotropic, so that the openings 114 in the protective mask layer 108 are extended through the third mask layer 106 and have about the same sizes in the third mask layer 106 as they do in the protective mask layer 108. The resulting structure is illustrated in FIG. 4. The etching process that etches the third mask layer 106 may include a wet etching process, a dry etching process, or a combination. In some embodiments, a dry etching process may be a plasma etching process including a plasma generated with a power between about 100 Watts and about 2000 Watts. The plasma etching process may be performed at a pressure between about 0.01 mTorr and about 10 mTorr and at a process temperature between about 20° C. and about 200° C. The plasma etching process may include one or more process gases such as $CF_4$, $CH_2F_2$, $CH_3F$, $CHF_3$, $Cl_2$, Ar, $O_2$, another type of process gas, or a combination. Other etching techniques may be used in other embodiments. During the etching of the third mask layer 106, the second mask layer 104 may be at least partially consumed. After the etching of the third mask layer 106, portions of the protective mask layer 108 may remain (as shown in FIG. 4). In some embodiments, the remaining portions of the protective mask layer 108 may be removed using, for example, a wet etching process. In other embodiments, the remaining portions of the protective mask layer 108 are left remaining over the patterned third mask layer 106, for example, to be used as a protective layer.

Referring to FIG. 5, the pattern of the third mask layer 106 is transferred to the second mask layer 104 in an etching process. The etching process may be anisotropic, so that the openings 114 in the third mask layer 106 are extended through the second mask layer 104 and have about the same sizes in the second mask layer 104 as they do in the third mask layer 106. The resulting structure is illustrated in FIG. 5. The etching process that etches the second mask layer 104 may include a wet etching process, a dry etching process, or a combination. In some embodiments, a dry etching process may be a plasma etching process including a plasma generated with a power between about 100 Watts and about 2000 Watts. The plasma etching process may be performed at a pressure between about 0.01 mTorr and about 10 mTorr and at a process temperature between about 20° C. and about 200° C. The plasma etching process may include one or more process gases such as $CF_4$, $CH_2F_2$, $CH_3F$, $CHF_3$, $Cl_2$, Ar, $O_2$, another type of process gas, or a combination. Other etching techniques may be used in other embodiments. During the etching of the second mask layer 104, the IMD layer 102 may be partially consumed. After the etching of the second mask layer 104, portions of the third mask layer 106 may remain (as shown in FIG. 5).

Figure 6:
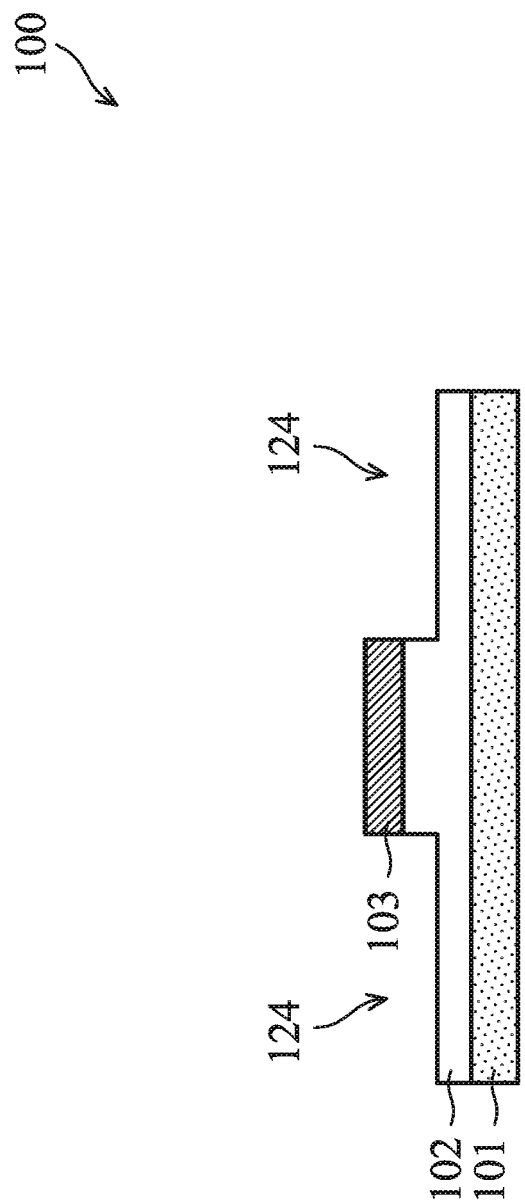
FIGS. 6-7 illustrate the patterning of an inter-metal dielectric (IMD) layer in accordance with some embodiments.
Figure 7:
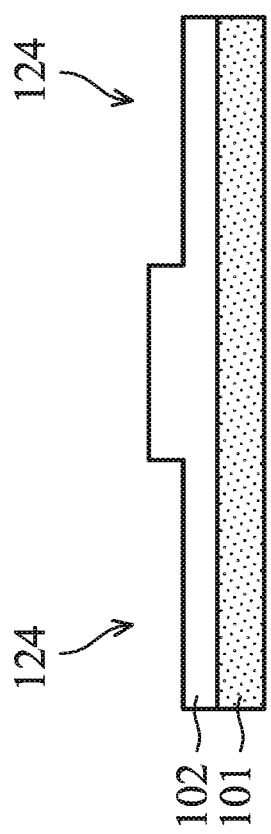

In FIG. 6, the second mask layer 104 is used as an etching mask to extend openings 114 through the first mask layer 103 into the IMD layer 102, thus forming openings 124 in the IMD layer 102. The openings 124 may expose contacts, metal lines, or other conductive features within the IMD layer 102 or beneath the IMD layer 102, such as conductive features within the substrate 101 or within another layer beneath the IMD layer 102. Etching the IMD layer 102 may include an anisotropic dry etch process and/or a wet etch process, which etches through the first mask layer 103 to the IMD layer 102. In some embodiments, the first mask layer 103 is etched in a separate etching step than the etching of openings 124 in the IMD layer 102. Unetched portions of the IMD layer 102 may have a same pattern as the first mask layer 103 of FIG. 6. After the openings 124 are patterned, a wet cleaning process may be performed to remove any remaining portions of the first mask layer 103, resulting in the structure shown in FIG. 7.

Referring to FIGS. 8-10B, conductive lines may be formed in the openings 124 patterned in the IMD layer 102. In FIG. 8, one or more liners 114 may be formed along sidewalls and a bottom surface of the openings 124. The liners 114 may include TiO, TiN, TaO, TaN, or the like, and may provide diffusion barrier, adhesion, and/or seed layers for the conductive lines. The liners 114 may be deposited using any suitable process, such as PVD, CVD, ALD, and the like. In FIG. 9, a conductive material 116 is formed over the liners 114. The conductive material 114 may be initially deposited over the liners 114 and may overfill the openings 124, as shown in FIG. 9. The conductive material 116 may be a suitable conductive material such as copper, another metal, or another conductive material, and may be deposited using a process such as PVD, plating, or the like.

Referring to FIGS. 10A-B, a planarization process may be performed to remove excess portions of the conductive material 116 over the IMD layer 102. In this manner, conductive lines 126 may be formed in the IMD layer 102. The ends of adjacent conductive lines 126 may be separated along the Y-axis by a distance L2, which may be between about 10 nm and about 30 nm. In some embodiments, the separation L2 may be between about 25% and about 75% of the separation L1, such as the separation L2 being about 50% of the separation L1. In some cases, the separation distance L2 may be about the same as the separation distance L1'. In this manner, conductive lines may be formed having a smaller end-to-end separation distance by using a directional etching process. By reducing the end-to-end separation distance, the pattern density of conductive lines within metallization layers may be increased, and the size of a semiconductor device may be reduced.

Figure 11:
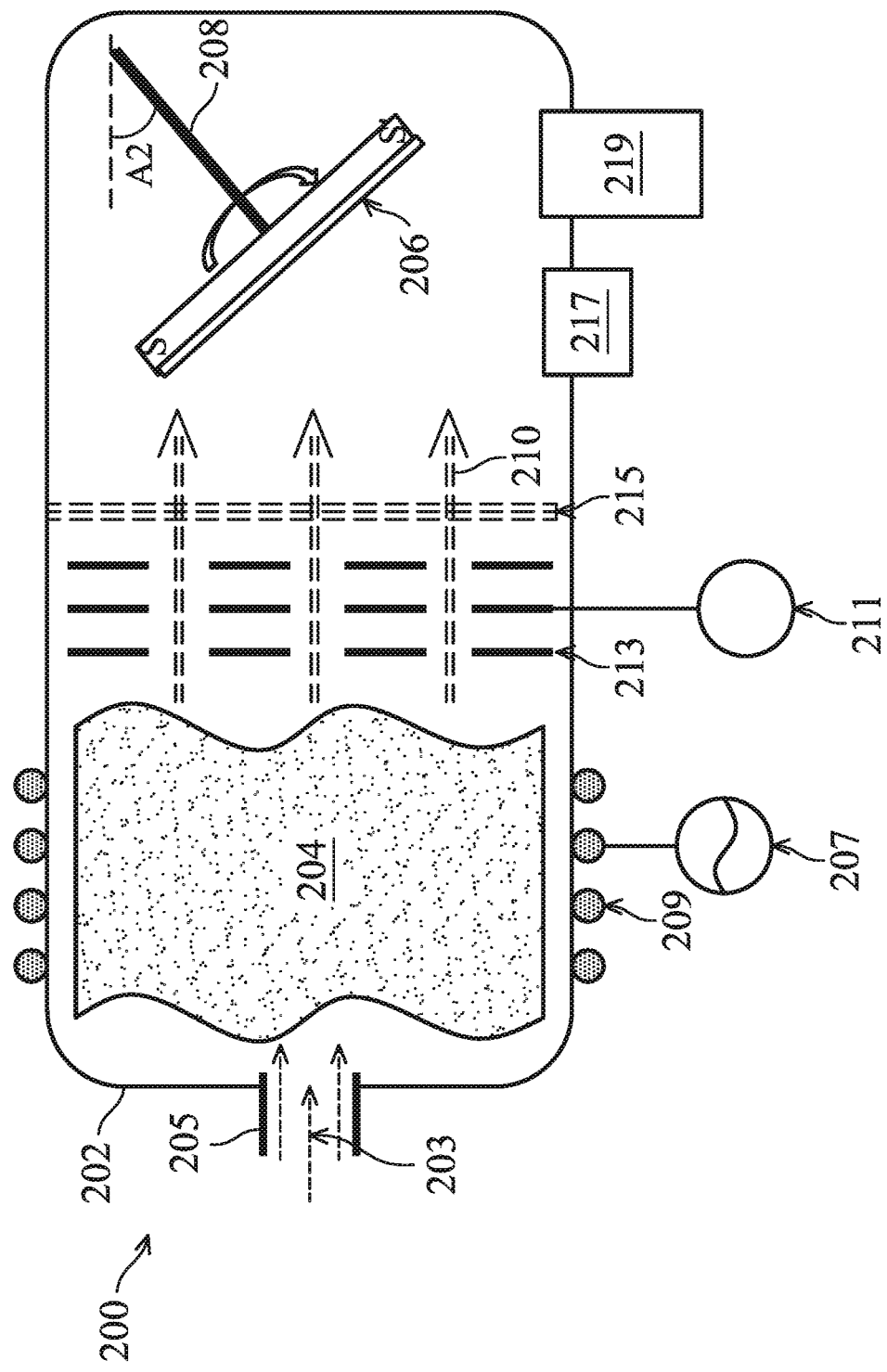
FIG. 11 illustrates a first system used to perform a directional etching process in accordance with some embodiments.
Figure 12:
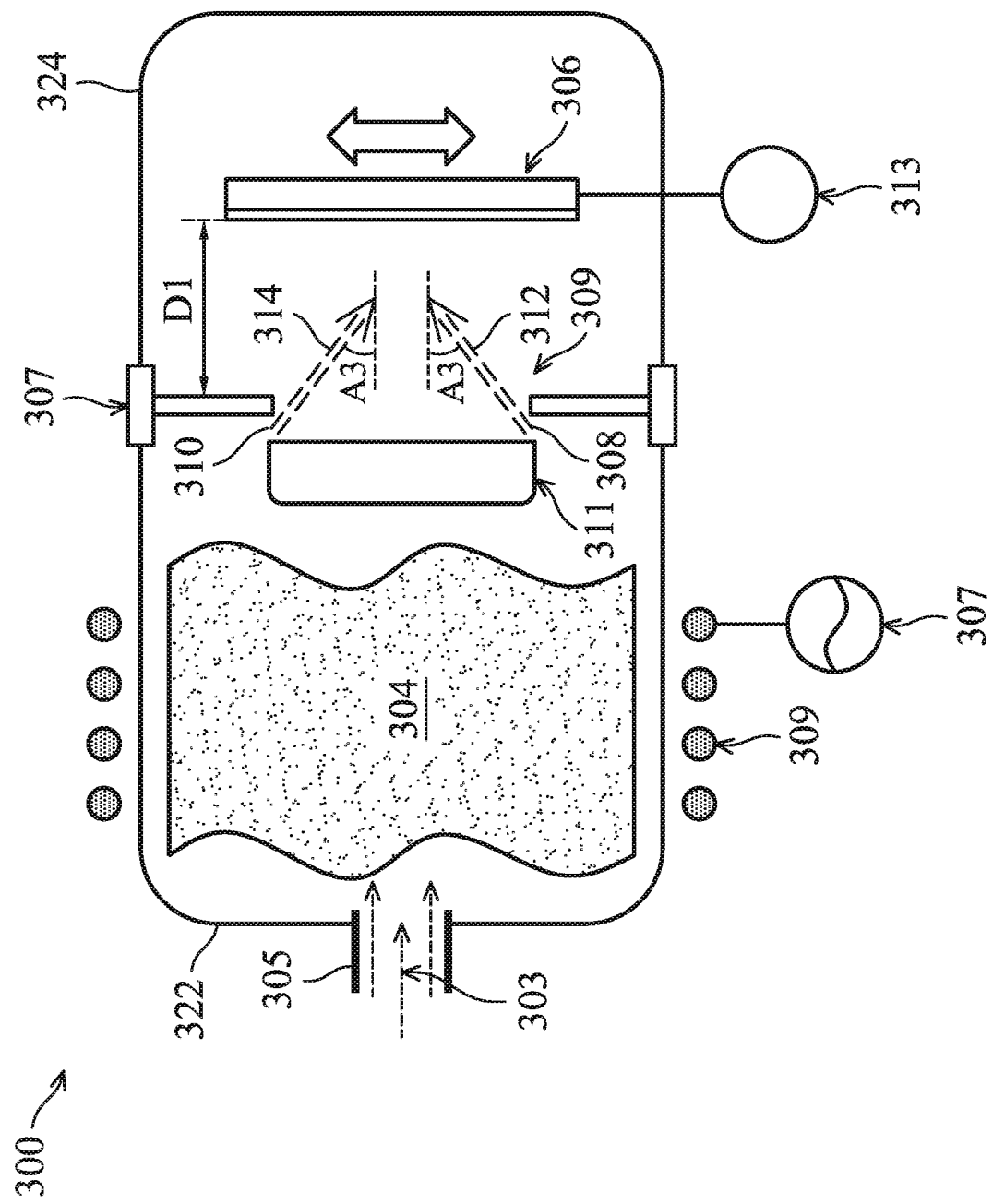
FIG. 12 illustrates a second system used to perform a directional etching process in accordance with some embodiments.
Figure 13A:
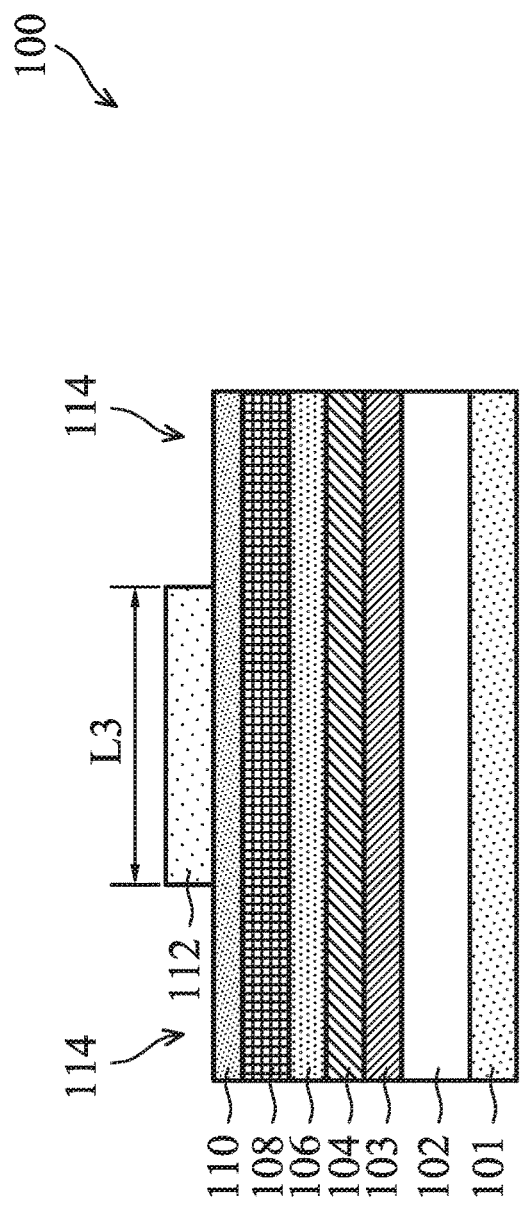
FIGS. 13A-B illustrate a plan view and a cross-sectional view of the patterning of a photoresist layer in accordance with some embodiments.
Figure 13B:
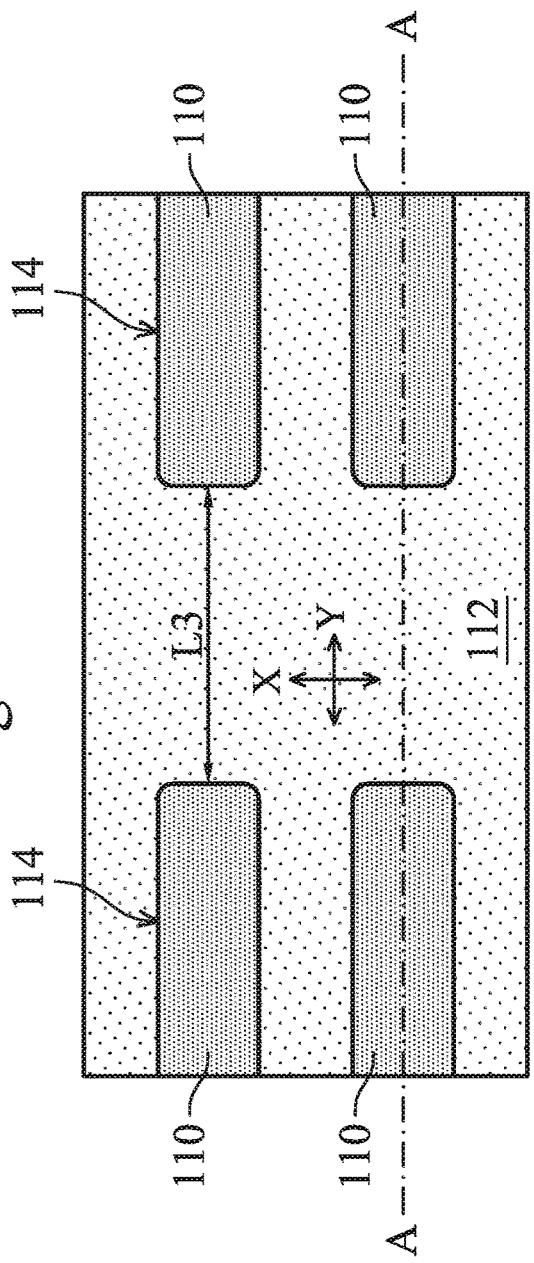

FIG. 11 and FIG. 12 illustrate plasma etching systems that may be used to perform the directional etching process 150, according to some embodiments. The plasma etching systems may be, for example, ion beam etching systems. FIG. 11 shows a first plasma etching system 200 that includes a process chamber 202 in which a process wafer 206 is placed.

Process gases 203 may be introduced into the process chamber 202 via an inlet 205. The first plasma etching system 200 includes a radio frequency system 207 coupled to an RF coil 209 that is used to generate a plasma 204 within the process chamber 202. The plasma 204 may be generated using other techniques in other embodiments. In some embodiments, the plasma 204 is a remote plasma generated in a separate chamber that is connected to the process chamber 202. A bias voltage system 211 is coupled to a grid 213 disposed between the plasma 204 and the process wafer 206. By biasing the grid 213 with one or more voltages, the bias voltage system 211 can accelerate ions 210 formed within the plasma 204 towards the process wafer 206. The first plasma etching system 200 may also include a shutter 215 that can be opened or closed to permit or block accelerated ions 210 from reaching the process wafer 206. The first plasma etching system 200 may also include other components, such as an end point detection system 217, a pump 219, or other components. The process wafer 206 is mounted to a fixture 208 that is configured to hold the process wafer 206 at an angle A2 relative to the acceleration vector of the accelerated ions 210. The angle A2 may be between about 10° and about 80°. The fixture 208 is also configured to rotate the process wafer 206 about an axis which is parallel to the angle A2. In this manner, the fixture 208 may hold the process wafer 206 such that the ions 210 are directed toward the process wafer 206 at a shallow angle, as described previously with respect to FIGS. 2A-B. In order to direct the ions 210 toward the process wafer 206 in opposite directions (e.g., both Y-axis directions), the fixture 208 may rotate the process wafer 180°. For example, FIG. 11 shows side S of the process wafer 206 as being closest to the incoming ions 210, corresponding to etching in one direction. To etch in the opposite direction, the fixture 208 may rotate the process wafer 206 such that the opposite side S' is closest to the incoming ions 210, corresponding to etching in the opposite direction. In this manner, the directional etching process 150 may be performed, and variations or other embodiments of the first plasma etching system 200 are considered within the scope of this disclosure.

Turning to FIG. 12, a second plasma etching system 300 includes a process chamber 324 in which a process wafer 306 is placed and a plasma generation chamber 322 in which a plasma 304 is generated. The process chamber 324 is isolated from the plasma generation chamber 322 by a flange 307 and an aperture assembly 309. The aperture assembly 309 includes a first aperture 308 and a second aperture 310 that are separated by an offset blocking element 311. Process gases 303 may be introduced into the plasma generation chamber 322 via an inlet 305. The second plasma etching system 300 includes a radio frequency system 307 coupled to an RF coil 309 that is used to generate a plasma 304 within the plasma generation chamber 322. The plasma 304 may be generated using other techniques in other embodiments.

Still referring to FIG. 12, a bias voltage system 313 is coupled to the process wafer 306, which may generate an electric field between the process wafer 306 and the plasma generation chamber 322 and/or the aperture assembly 309. Under the influence of the generated electric field, ions formed within the plasma 304 are accelerated as ion beams 312 and 314 through apertures 308 and 310 toward the process wafer 306. The apertures 308, 310 are shaped and oriented such that the ion beams 312, 314 are directed by the electric field towards the process wafer 306 at an angle relative to the process wafer 306. The apertures 308, 310 may also be configured to direct beams of ions 312 and 314 respectively toward the process wafer 306 in opposite directions. The ion beams 312, 314 may be directed toward the process wafer 306 such that they impinge on the process wafer 306 at an angle A3 between about 20° and about 60°. In this manner, ions are from the plasma generation chamber 322 to the process chamber through the first aperture 324 and the second aperture 310, wherein the ions are accelerated through the first aperture 308 in the first ion beam 312 and through the second aperture 310 in the second ion beam 314, wherein the first ion beam 312 impinges on the process wafer 306 at the angle A3 from a first direction and the second ion beam 314 impinges on the process wafer 306 at the angle A3 from a second direction opposite the first direction. FIG. 12 shows the ion beams 312, 314 as approaching the process wafer 306 in straight lines, but in some cases the ion beams 312, 314 may curve toward the process wafer 306. The process wafer 306 is mounted to a fixture that is configured to move the process wafer 306 parallel to the aperture assembly 309, and which also may be configured to adjust the distance D1 between the process wafer 306 and the apertures 308, 310. Moving the process wafer 306 parallel to the apertures 308, 310 can help ensure that desired regions of the process wafer 306 are exposed to the ion beams 312, 314. In some embodiments, adjusting the distance D1 can also adjust the angle A3 of the ion beams 312, 314 of impingement on the process wafer 306. In some embodiments, the process wafer 306 is mounted onto the fixture using an edge ring, which may be made of a material such as silicon. The distance D1 may be between about 5 mm and about 30 mm in some embodiments. In this manner, the directional etching process 150 may be performed, and variations or other embodiments of the second plasma etching system 300 are considered within the scope of this disclosure.

In the embodiment process shown in FIGS. 1A-10B, a directional etching process is performed on the sidewalls of a photoresist layer to increase the size of patterned openings along desired directions. However, in other embodiments, a directional etching process may be performed on one or more other layers to increase the size of patterned openings along desired directions. FIGS. 13A-25B illustrate intermediate steps of different process flows using directional etching processes performed on different layers to form metal lines, according to some embodiments. FIGS. 13A-16 illustrate intermediate steps in a process flow in which a directional etching process is performed on the protective mask layer 108. FIGS. 17A-21 illustrate intermediate steps in a process flow in which a directional etching process is performed on the third mask layer 106. FIGS. 22A-25B illustrate intermediate steps in a process flow in which a directional etching process is performed on the second mask layer 104. While the process flows described herein describe the directional etching process being performed a single time, in other embodiments, more than one directional etching process may be performed in a process flow, with different directional etching processes performed on different layers in separate steps.

Figure 14:
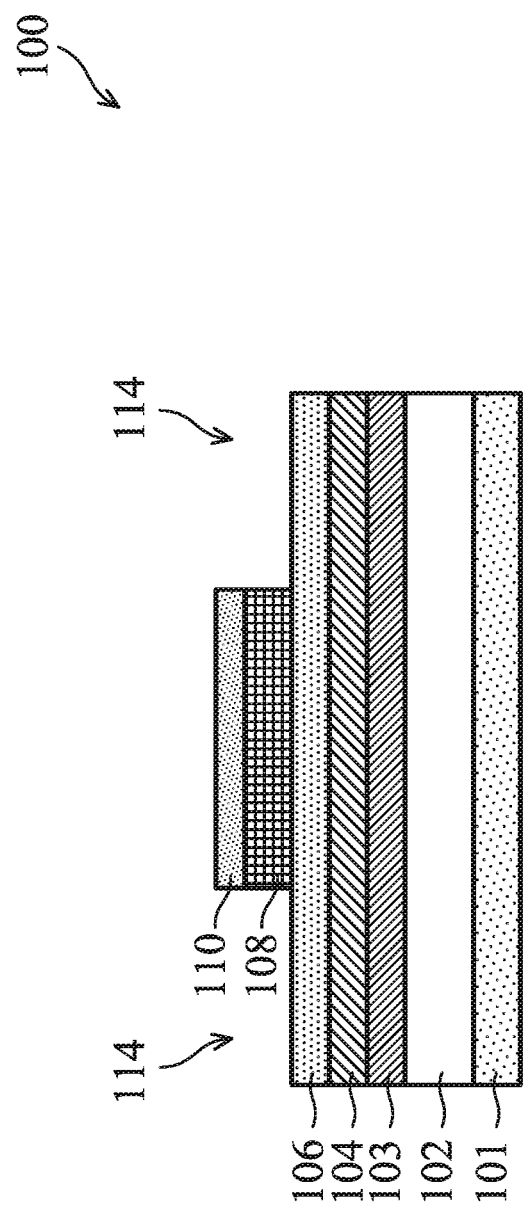
FIG. 14 illustrates the patterning of a mask layer in accordance with some embodiments.

Turning to FIGS. 13A-16, FIGS. 13A-B show a semiconductor device 100 having a patterned photoresist layer 112, which may be similar to that shown in FIGS. 1A-B. Openings 114 have been formed in the photoresist layer 112, and ends of adjacent openings 114 may be separated along the Y-axis by a distance L3, which may be between about 30 nm and about 50 nm, and may be about the same as separation distance L1. As shown in FIG. 14, an etching process may be performed to transfer the pattern of the photoresist layer 112 to the protective mask layer 108, thereby extending the openings 114 through the ARC 110 and the protective mask layer 108. The etching process of the protective mask layer 108 is anisotropic, so that the openings 114 in the photoresist layer 112 are extended through the protective mask layer 108 and have about the same sizes in the protective mask layer 108 as they do in the photoresist layer 112. In some embodiments, remaining portions of the photoresist layer 112 may be removed using a wet cleaning process or a dry cleaning process (e.g., an ashing process).

Figure 15A:
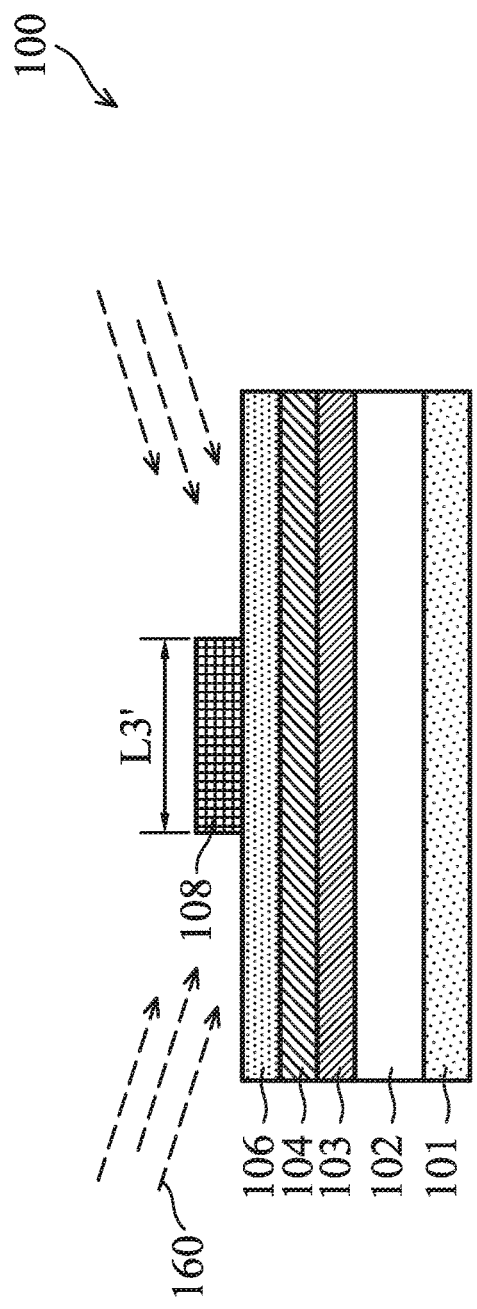
FIGS. 15A-B illustrate a plan view and a cross-sectional view of the performing a directional etching process in accordance with some embodiments.
Figure 15B:
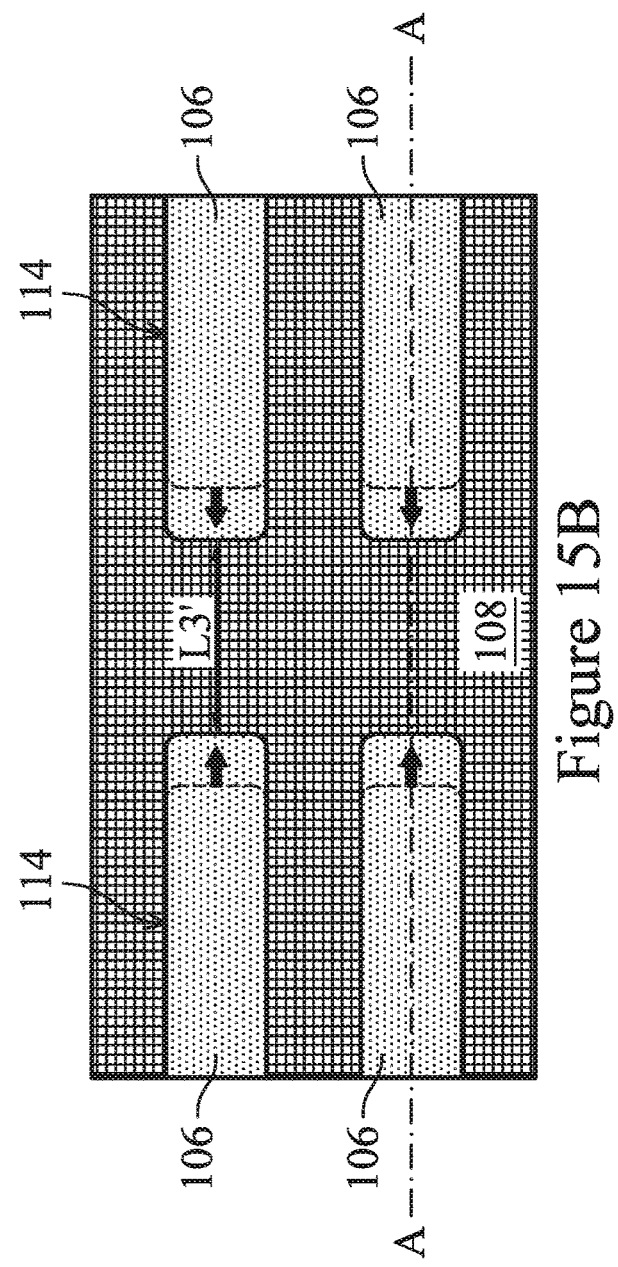
Figure 17A:
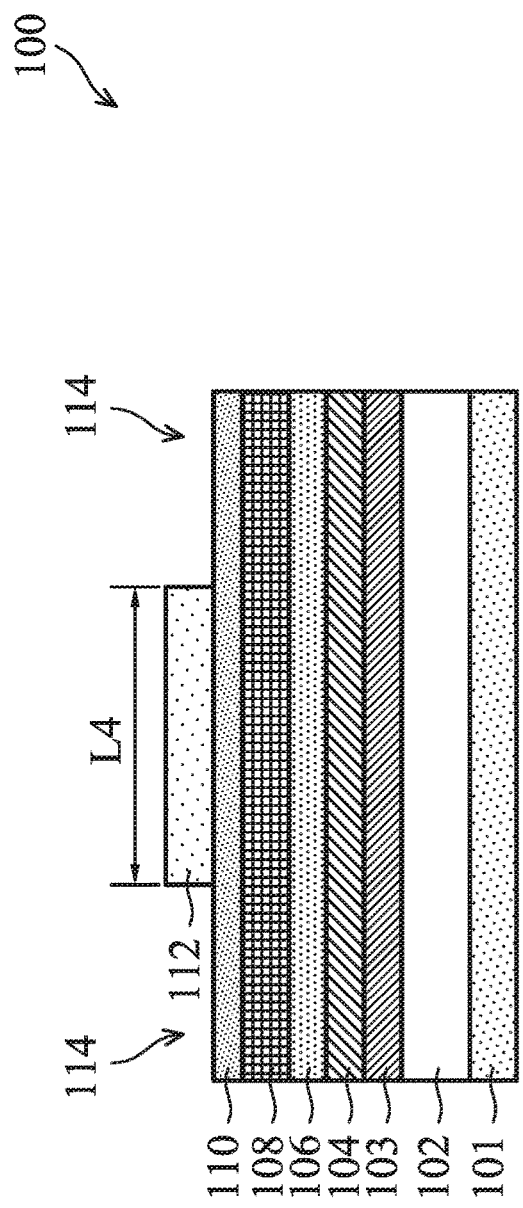
FIGS. 17A-B illustrate a plan view and a cross-sectional view of the patterning of a photoresist layer in accordance with some embodiments.
Figure 17B:
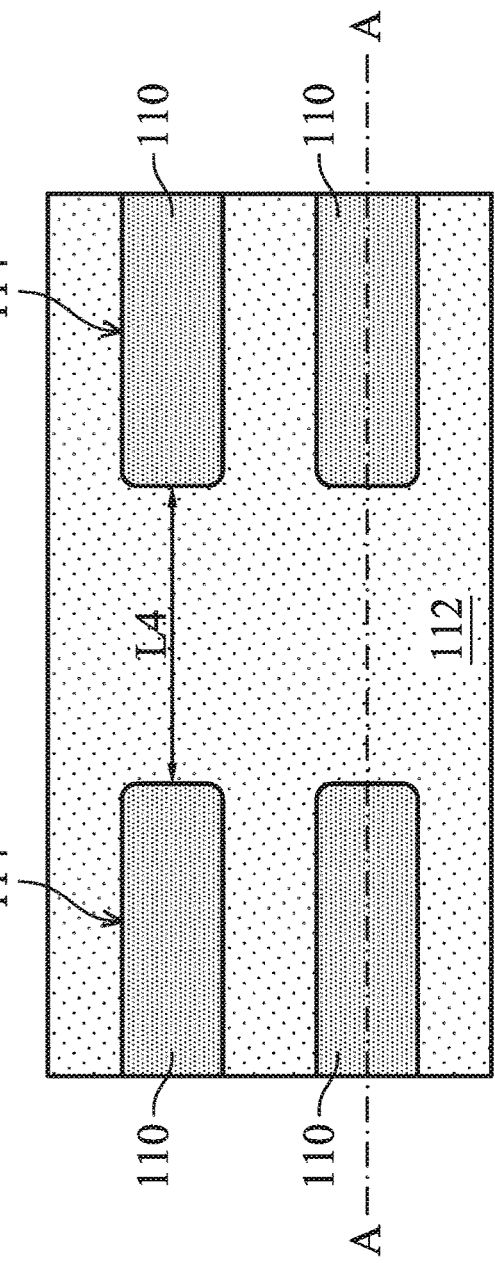

Turning to FIGS. 15A-B, a directional etching process 160 is performed to etch sidewalls of the protective mask layer 108. The directional etching process 160 may be similar to the directional etching process 150 described previously. The directional etching process 160 may etch a lateral distance between about 10 nm and about 30 nm. For example, the Y-axis separation L3' may be between 10 nm and about 30 nm after the directional etching process 160 is performed in both Y-axis directions. In some embodiments, after the directional etching process 160, the separation L3' may be between about 25% and about 75% of the initial separation L3, such as the separation L3' being about 50% of the separation L3. As shown in FIG. 15A-B, the sidewalls of the protective mask layer 108 that are facing the X-axis are etched less than sidewalls facing the Y-axis.

In some embodiments, the directional etching process 160 includes generating a plasma with a power between about 100 Watts and about 2000 Watts. The directional etching process 160 may be performed at a pressure between about 0.1 mTorr and about 10 mTorr and at a process temperature between about 20° C. and about 200° C. In some embodiments, the directional etching process 160 may be performed using a voltage bias between about 100 V and about 2000 V. In some embodiments, the directional etching process 160 may use one or more process gases such as $CF_4$, $CH_2F_2$, $CH_3F$, $CHF_3$, $Cl_2$, Ar, $O_2$, another type of process gas, or a combination.

In some embodiments, the directional etching process 160 includes forming and directing an ion beam using, for example, an ion implantation device or the like. Ions used during the directional etching process 160 may include germanium ions, phosphorous ions, arsenic ions, argon ions, oxygen ions, fluorine ions, other species of ions, or combinations of these. In some embodiments, the ions may have an energy that is between about 0.5 keV and about 2 keV.

In some cases, the etched sidewalls of the protective mask layer 108 may have a vertical profile, concave profile, or an irregular profile. In some cases, the use of a plasma etching process with a fluorine-containing process gas such as $CF_4$, $CH_2F_2$, $CH_3F$, $CHF_3$, or the like, can produce etched sidewalls of the protective mask layer 108 having a more vertical profile. A fluorine-containing process gas may also remove more of the ARC 110 during the directional etching process 160.

Referring to FIG. 16, after performing the directional etching process 160 on the protective mask layer 108, the pattern of the protective mask layer 108 is transferred to the third mask layer 106 in an etching process. This etching process may be similar to the etching process as described above with respect to FIG. 4. The process may then continue similarly as described in FIGS. 5-10B to form metal lines having a reduced end-to-end separation distance.

Figure 18:
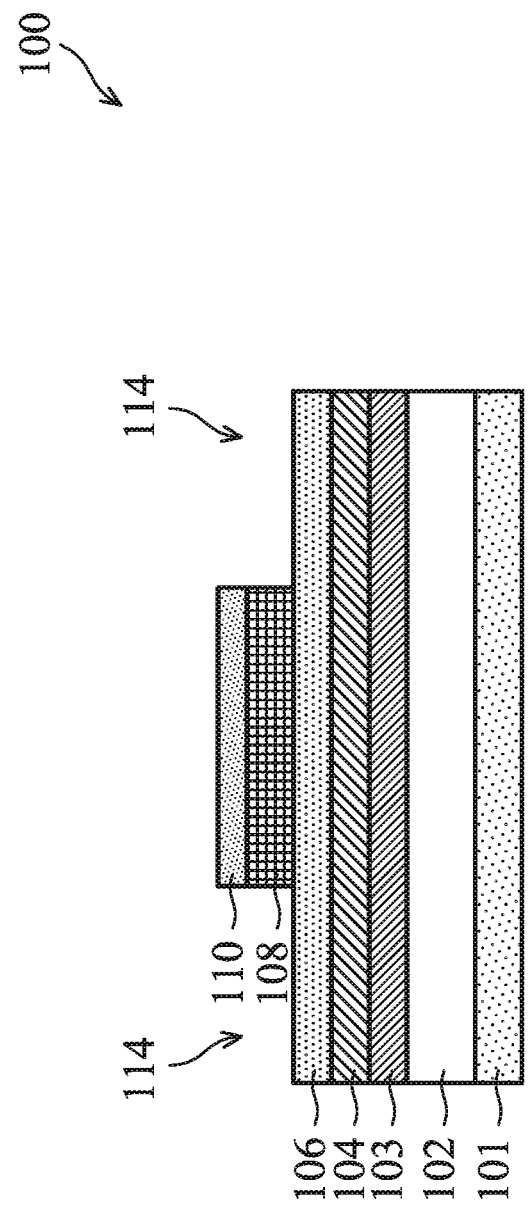
FIGS. 18-19 illustrate the patterning of mask layers in accordance with some embodiments.
Figure 19:
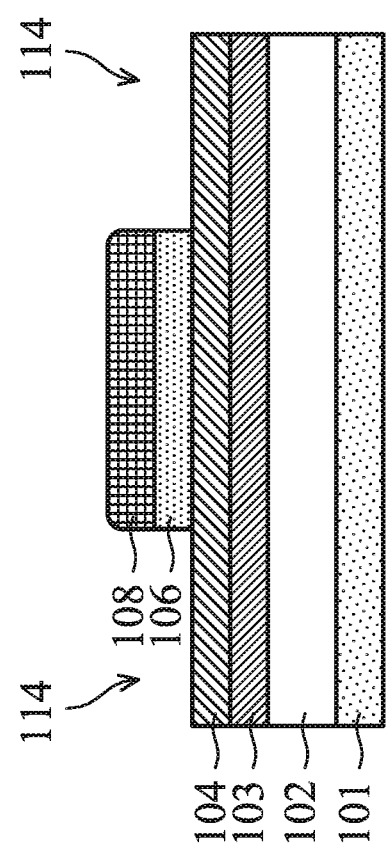

Turning to FIGS. 17A-21, FIGS. 17A-B show a semiconductor device 100 having a patterned photoresist layer 112, which may be similar to that shown in FIGS. 1A-B or 13A-B. Openings 114 have been formed in the photoresist layer 112, and ends of adjacent openings 114 may be separated in the Y-axis by a distance L4, which may be between about 30 nm and about 50 nm, and may be about the same as separation distance L1. As shown in FIG. 18, an etching process may be performed to transfer the pattern of the photoresist layer 112 to the protective mask layer 108, thereby extending the openings 114 through the ARC 110 and the protective mask layer 108. This etching process may be similar to the etching process as described above with respect to FIGS. 3A-B. In FIG. 19, an etching process may be performed to transfer the pattern of the protective mask layer 108 to the third mask layer 106, thereby extending the openings 114 through the third mask layer 106. This etching process may be similar to the etching process as described above with respect to FIG. 4.

Figure 20A:
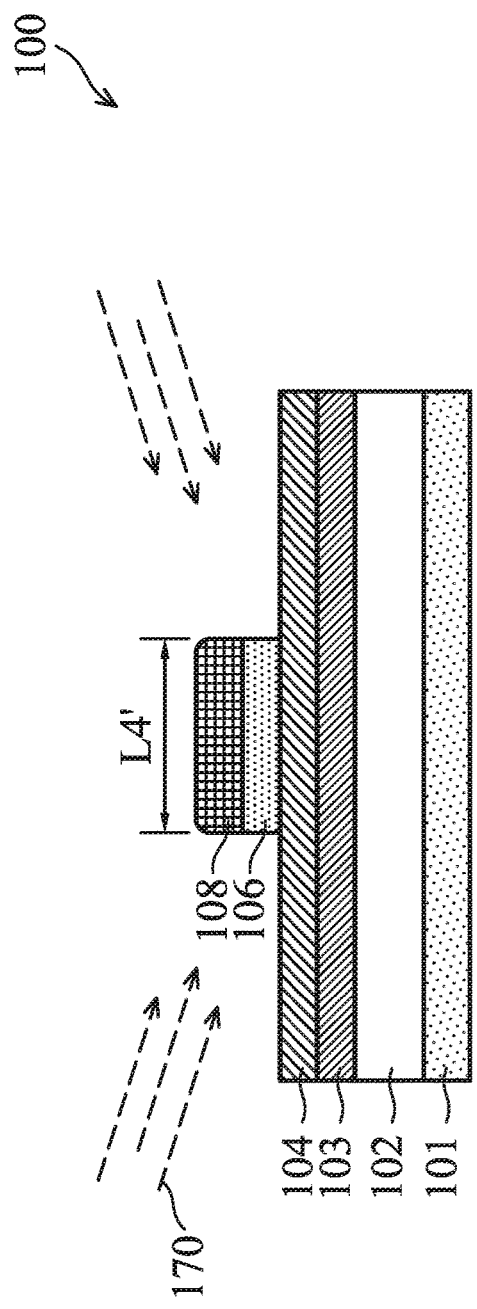
FIGS. 20A-B illustrate a plan view and a cross-sectional view of the performing a directional etching process in accordance with some embodiments.
Figure 20B:
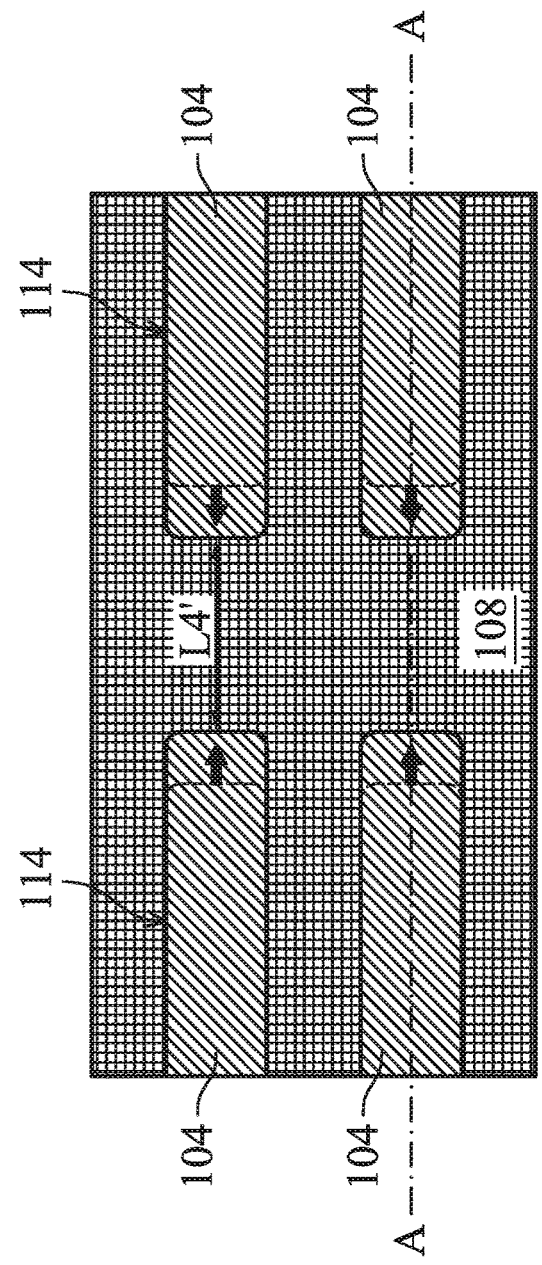

In FIGS. 20A-B, a directional etching process 170 is performed to etch sidewalls of the third mask layer 106. The directional etching process 170 may be similar to the directional etching process 150 described previously. The directional etching process 170 may etch a lateral distance between about 10 nm and about 30 nm. For example, the Y-directional separation L4' may be between 10 nm and about 30 nm after the directional etching process 170 is performed in both Y-axis directions. In some embodiments, after the directional etching process 170, the separation L4' may be between about 25% and about 75% of the initial separation L4, such as the separation L4' being about 50% of the separation L4. As shown in FIG. 20A-B, the sidewalls of the third mask layer 106 that are facing the X-axis are etched less than sidewalls facing the Y-axis. In some embodiments, portions of the protective mask layer 108 remaining over the third mask layer 106 are used to protect the third mask layer 106 from top surface loss during the directional etching process 170.

In some embodiments, the directional etching process 170 includes generating a plasma with a power between about 100 Watts and about 2000 Watts. The directional etching process 170 may be performed at a pressure between about 0.01 mTorr and about 10 mTorr and at a process temperature between about 20° C. and about 200° C. In some embodiments, the directional etching process 170 may be performed using a voltage bias between about 100 V and about 2000 V. In some embodiments, the directional etching process 170 may use one or more process gases such as $CF_4$, $CH_2F_2$, $CH_3F$, $CHF_3$, $Cl_2$, Ar, $O_2$, another type of process gas, or a combination.

In some embodiments, the directional etching process 170 includes forming and directing an ion beam using, for example, an ion implantation device or the like. Ions used during the directional etching process 170 may include germanium ions, phosphorous ions, arsenic ions, argon ions, oxygen ions, fluorine ions, other species of ions, or combinations of these. In some embodiments, the ions may have an energy that is between about 0.5 keV and about 2 keV.

Figure 21:
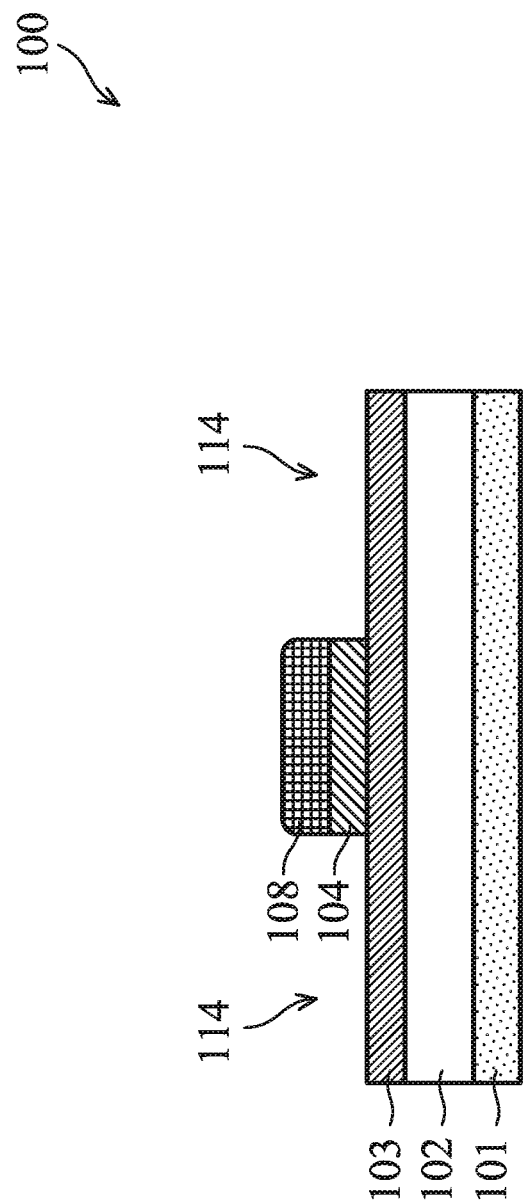
FIG. 21 illustrates the patterning of a mask layer in accordance with some embodiments.
Figure 22A:
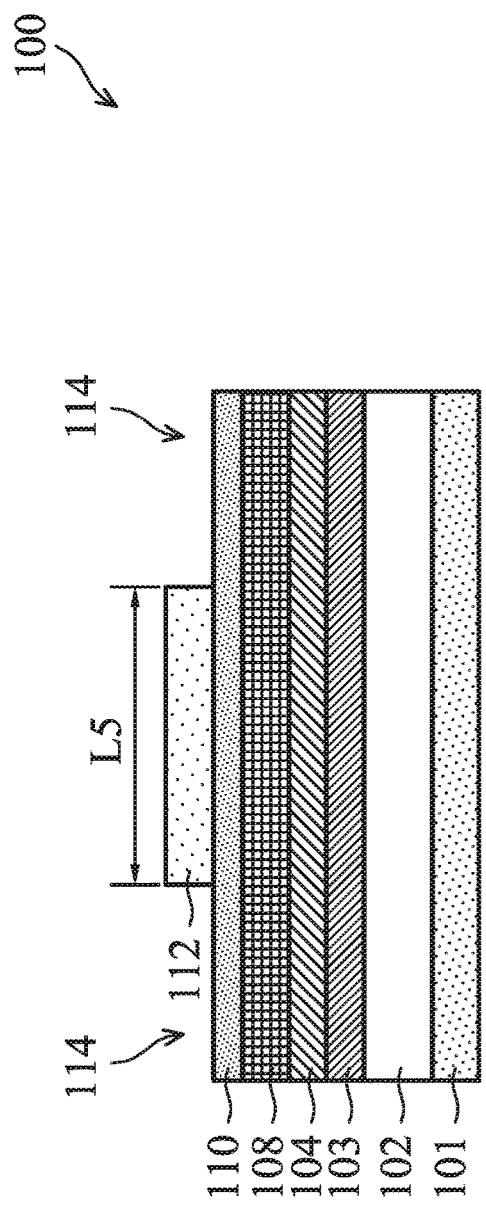
FIGS. 22A-B illustrate a plan view and a cross-sectional view of the patterning of a photoresist layer in accordance with some embodiments.
Figure 22B:
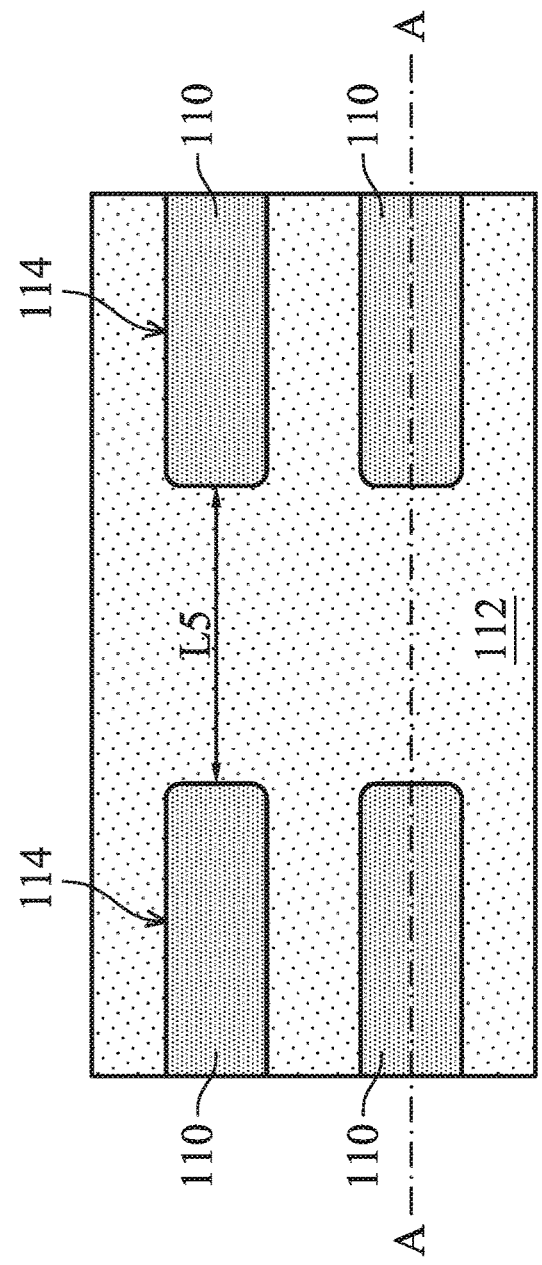

Referring to FIG. 21, after performing the directional etching process 170 on the third mask layer 106, the pattern of the third mask layer 106 is transferred to the second mask layer 104 in an etching process. This etching process may be similar to the etching process as described above with respect to FIG. 4. The process may then continue similarly as described in FIGS. 6-10B to form metal lines having a reduced end-to-end separation distance.

Figure 23:
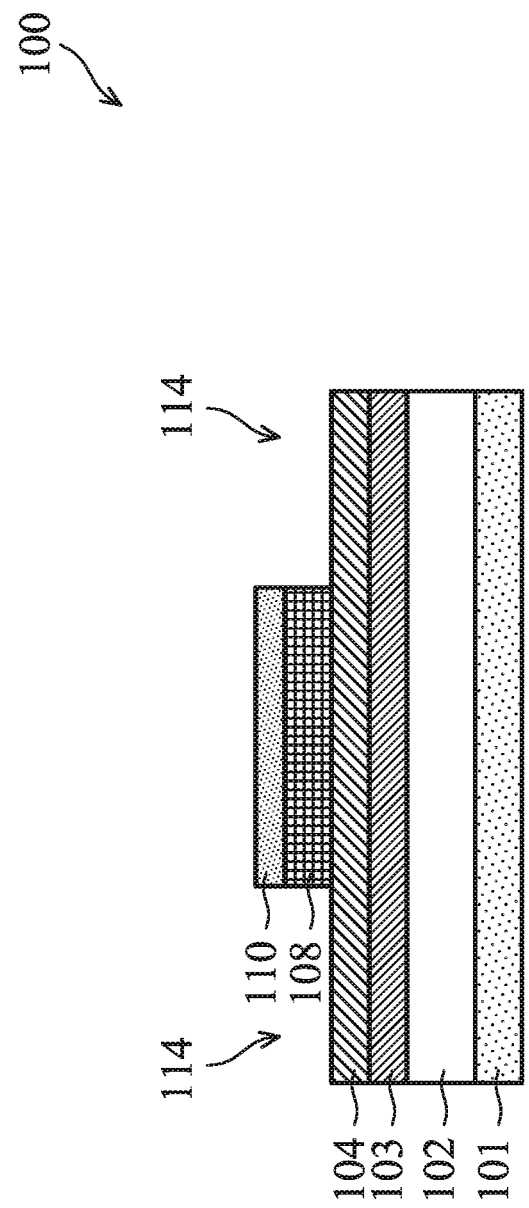
FIGS. 23-24 illustrate the patterning of mask layers in accordance with some embodiments.
Figure 24:
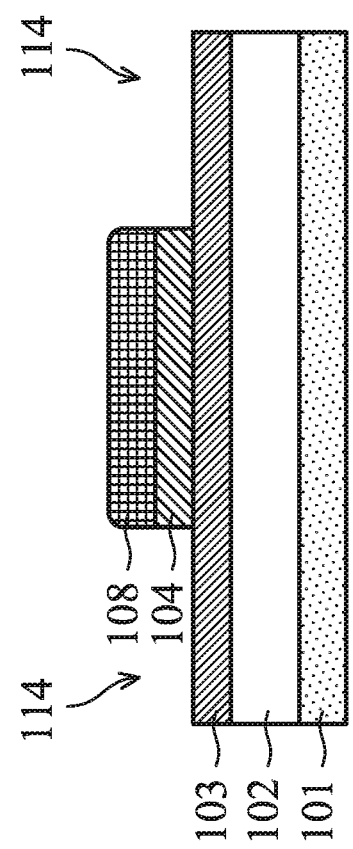

Turning to FIGS. 22A-25B, FIGS. 22A-B show a semiconductor device 100 having a patterned photoresist layer 112, which may be similar to that shown in FIGS. 1A-B except that the third mask layer 106 is omitted. Openings 114 have been formed in the photoresist layer 112, and ends of adjacent openings 114 may be separated in the Y-axis by a distance L5, which may be between about 30 nm and about 50 nm, and may be about the same as separation distance L1. As shown in FIG. 23, an etching process may be performed to transfer the pattern of the photoresist layer 112 to the protective mask layer 108, thereby extending the openings 114 through the ARC 110 and the protective mask layer 108. This etching process may be similar to the etching process as described above with respect to FIGS. 3A-B. In FIG. 24, an etching process may be performed to transfer the pattern of the protective mask layer 108 to the second mask layer 104, thereby extending the openings 114 through the second mask layer 104. This etching process may be similar to the etching process as described above with respect to FIG. 4 or FIG. 5. In some embodiments, remaining portions of the protective mask layer 108 are left over the second mask layer 104 after the etching process. In this manner, the remaining portions of the protective mask layer 108 may protect the top surface of the second mask layer 104 during the subsequent directional etching process 180, and reduce the amount of material of the top surface of the second mask layer 104 that is etched during the directional etching process 180.

In FIGS. 25A-B, a directional etching process 180 is performed to etch sidewalls of the second mask layer 104. The directional etching process 180 may be similar to the directional etching process 150 described previously. The directional etching process 180 may etch a lateral distance between about 10 nm and about 30 nm. For example, the Y-axis separation L5' may be between 10 nm and about 30 nm after the directional etching process 180 is performed in both Y-axis directions. In some embodiments, after the directional etching process 180, the separation L5' may be between about 25% and about 75% of the initial separation L5, such as the separation L5' being about 50% of the separation L5. As shown in FIG. 25A-B, the sidewalls of the second mask layer 104 that are facing the X-axis are etched less than sidewalls facing the Y-axis.

In some embodiments, the directional etching process 180 includes generating a plasma with a power between about 100 Watts and about 2000 Watts. The directional etching process 180 may be performed at a pressure between about 0.01 mTorr and about 10 mTorr and at a process temperature between about 20° C. and about 200° C. In some embodiments, the directional etching process 180 may be performed using a voltage bias between about 100 V and about 2000 V. In some embodiments, the directional etching process 180 may use one or more process gases such as $CF_4$, $CH_2F_2$, $CH_3F$, $CHF_3$, $Cl_2$, Ar, $O_2$, another type of process gas, or a combination.

In some embodiments, the directional etching process 180 includes forming and directing an ion beam using, for example, an ion implantation device or the like. Ions used during the directional etching process 180 may include germanium ions, phosphorous ions, arsenic ions, argon ions, oxygen ions, fluorine ions, other species of ions, or combinations of these. In some embodiments, the ions may have an energy that is between about 0.5 keV and about 2 keV.

After performing the directional etching process 180, the process may then continue similarly as described in FIGS. 6-10B to form metal lines having a reduced end-to-end separation distance. In some embodiments, portions of the protective mask layer 108 remaining over the second mask layer 104 are used to protect the second mask layer 104 from top surface loss during the directional etching process 180.

In some embodiments, the patterning methods described herein may be used to form conductive features such as conductive lines in a dielectric layer or other conductive features such as contacts. In some cases, the techniques described herein may be part of a damascene process or a dual damascene process for forming conducting features. The techniques described herein may be used to reduce the separation distance between conductive features, such as the end-to-end or "line cut" distance between conductive lines. Moreover, the separation distance may be reduced without the use of additional patterning steps, which may reduce process time and cost. By reducing the distance between conductive features, a greater density of conductive features may be formed in a device, which may improve device performance and reduce device size.

In some embodiments, a method includes forming a dielectric layer over a substrate, forming a first mask layer over the dielectric layer, forming a second mask layer over the first mask layer, patterning the second mask layer, performing a plasma etching process that etches exposed sidewalls of the patterned second mask layer, wherein first sidewalls facing a first direction are etched more than second sidewalls facing a second direction that is perpendicular to the first direction, after performing the plasma etching process, etching the first mask layer using the patterned second mask layer, and etching the dielectric layer using the first mask layer to form openings in the dielectric layer. In an embodiment, the plasma etching process uses $CF_4$ as a process gas. In an embodiment, the plasma etching process uses Ar and $O_2$ as process gases. In an embodiment, a roughness of the first sidewalls of the patterned second mask layer is reduced after the plasma etching process is performed. In an embodiment, during the plasma etching process, third sidewalls of the patterned second mask layer that are facing a third direction are etched more than the second sidewalls, wherein the third direction is opposite the first direction. In an embodiment, the first sidewalls and the third sidewalls are etched in separate steps of the plasma etching process. In an embodiment, the method includes filling the openings in the dielectric layer with a conductive material. In an embodiment, performing the plasma etching process includes mounting the substrate in a process chamber, wherein the substrate is mounted such that the vertical direction of the substrate is positioned at a nonzero angle relative to an ion beam direction, igniting a plasma within the process chamber, the plasma comprising ions, and accelerating ions from the plasma toward the substrate in the ion beam direction. In an embodiment, the plasma etching process etches exposed sidewalls of the patterned second mask layer more than the plasma etching process etches exposed top surfaces of the patterned second mask layer.

In some embodiments, a method includes depositing a second dielectric layer over a first dielectric layer, depositing a third dielectric layer over the second dielectric layer, patterning a plurality of first openings in the third dielectric layer, etching the second dielectric layer through the first openings to form second openings in the second dielectric layer, performing a plasma etching process directed at the second dielectric layer from a first direction, the plasma etching process extending the second openings in the first direction, and etching the first dielectric layer through the second openings to form third openings in the first dielectric layer. In an embodiment, the method includes depositing a conductive material in the third openings to form conductive lines in the first dielectric layer. In an embodiment, the method includes performing a plasma etching process directed at the first dielectric layer from the first direction, the plasma etching process extending the third openings in the first direction. In an embodiment, performing the plasma etching process includes accelerating ions toward the second dielectric layer at an angle between 10 degrees and 80 degrees relative to a top surface of the second dielectric layer. In an embodiment, depositing the second dielectric layer includes using CVD to deposit a layer that includes carbon. In an embodiment, at least two adjacent second openings are separated by less than about 20 nm in the first direction after performing the plasma etching process. In an embodiment, the plasma etching process extends the second openings in the first direction more than the plasma etching process extends the second openings in a second direction that is perpendicular to the first direction.

In some embodiments, a method includes forming a dielectric layer over a substrate, forming a first mask layer over the dielectric layer, the first mask layer including a first material, forming a second mask layer over the first mask layer, the second mask layer including a second material different from the first material, forming a patterned photoresist over the second mask layer, the photoresist including a third material different from the first material, etching the second mask layer using the patterned photoresist as an etch mask, etching the first mask layer using the second mask layer as an etch mask, wherein after the etching, the first mask layer includes first sidewalls, second sidewalls, and third sidewalls, wherein the second sidewalls have surfaces approximately parallel to surfaces of the first sidewalls, and wherein the third sidewalls have surfaces approximately perpendicular to surfaces of the first sidewalls, performing a etching process to etch first sidewalls, second sidewalls, and third sidewalls of the first mask layer, wherein the first sidewalls and the second sidewalls are etched more than the third sidewalls, and wherein portions of the second mask layer remain on the first mask layer during the etching process. In an embodiment, performing the etching process includes directing an ion beam toward the substrate using an ion implantation device. In an embodiment, forming the second mask layer includes using a spin-on coating process, and wherein the second material includes a spin-on carbon material. In an embodiment, performing the etching process includes placing the substrate in a process chamber, wherein the process chamber is isolated from a plasma generation chamber by an aperture assembly, wherein the aperture assembly includes a first aperture and a second aperture between the process chamber and the plasma generation chamber, igniting a plasma within the plasma generation chamber, and accelerating ions from the plasma generation chamber to the process chamber through the first aperture and the second aperture, wherein the ions are accelerated through a first aperture in a first ion beam and through the second aperture in a second ion beam, wherein the first ion beam impinges on the substrate at a first angle from a first direction and the second ion beam impinges on the substrate at the first angle from a second direction opposite the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
mounting a substrate on a holder in a process chamber, wherein the substrate comprises a patterned layer, wherein the substrate faces a first direction;
forming a plasma in the process chamber;
applying a bias voltage to a grid to accelerate ions toward the substrate, wherein the grid is between the substrate and the plasma, wherein applying the bias voltage accelerates ions from the plasma toward the substrate in a second direction, wherein the second direction is at an oblique angle to the first direction, wherein the ions etch sidewall portions of the patterned layer that face the second direction; and
using the patterned layer as an etching mask.

2. The method of claim 1, wherein the ions etch sidewall portions of the patterned layer that do not face the second direction a smaller amount than the ions etch sidewall portions of the patterned layer that face the second direction.

3. The method of claim 1 further comprising closing a shutter between the grid and the substrate to block ions from reaching the substrate.

4. The method of claim 1, wherein the angle between the first direction and the second direction is in the range of 10° to 80°.

5. The method of claim 1 further comprising rotating the substrate 180° by rotating the holder.

6. The method of claim 5, wherein the substrate is rotated after etching first sidewall portions of the patterned layer and before etching second sidewall portions of the patterned layer.

7. The method of claim 1, wherein forming the plasma comprises generating a remote plasma in a separate chamber connected to the process chamber.

8. The method of claim 1, wherein the ions etch sidewall portions of the patterned layer a lateral distance in the range of 10 nm to 30 nm.

9. A method comprising:
placing a substrate in a process chamber, wherein the process chamber is isolated from a plasma generation chamber by an aperture assembly, wherein the aperture assembly comprises a first aperture and a second aperture between the process chamber and the plasma generation chamber;
igniting a plasma within the plasma generation chamber; and
accelerating ions from the plasma generation chamber to the process chamber through the first aperture and the second aperture, wherein the ions are accelerated through the first aperture to form a first ion beam and the ions are accelerated through the second aperture to form a second ion beam, wherein the first ion beam impinges on the substrate at a first oblique angle from a first direction and the second ion beam impinges on the substrate at the first oblique angle from a second direction that is opposite the first direction.

10. The method of claim 9, wherein the first oblique angle is in the range of 30° to 70°.

11. The method of claim 9, wherein the first ion beam and the second ion beam are curved.

12. The method of claim 9 further comprising translating the substrate parallel to the first direction as the first ion beam and the second ion beam impinge on the substrate.

13. The method of claim 9, wherein accelerating ions from the plasma generation chamber to the process chamber comprises applying a bias voltage to the substrate.

14. The method of claim 9, wherein the aperture assembly comprises a blocking element extending from the first aperture to the second aperture.

15. The method of claim 9 further comprising translating the substrate to a position that is a predetermined distance from the first aperture and the second aperture.

16. The method of claim 15, wherein translating the substrate changes the first oblique angle.

17. A method, comprising:
forming a dielectric layer over a target layer;
patterning an opening in the dielectric layer, wherein the opening has a first pair of opposite sidewalls and a second pair of opposite sidewalls;
directing ions toward the first pair of opposite sidewalls, wherein the ions etch the first pair of opposite sidewalls more than the second pair of opposite sidewalls; and
performing an etch process to extend the opening into the target layer.

18. The method of claim 17, wherein the ions are simultaneously directed toward both sidewalls of the first pair of opposite sidewalls.

19. The method of claim 17, wherein the ions are directed toward the first pair of opposite sidewalls at an oblique angle.

20. The method of claim 17, wherein the ions are directed toward one of the sidewalls of the first pair of opposite sidewalls before the other of the sidewalls of the first pair of opposite sidewalls.

* * * * *